United States Patent
Benjamin et al.

(10) Patent No.: US 9,316,693 B2
(45) Date of Patent: Apr. 19, 2016

(54) METHOD AND SYSTEM FOR ESTIMATING STATE OF CHARGE OF A LITHIUM ELECTROCHEMICAL CELL HAVING A LITHIUM PHOSPHATE TYPE POSITIVE ELECTRODE

(71) Applicant: SAFT, Bagnolet (FR)

(72) Inventors: Sebastien Benjamin, Leognan (FR); Philippe Desprez, Bordeaux (FR); Ali Zenati, Bordeaux (FR); Gerard Barrailh, Gradignan (FR)

(73) Assignee: SAFT, Bagnolet (FR)

( * ) Notice: Subject to any disclaimer, the term of this patent is extended or adjusted under 35 U.S.C. 154(b) by 533 days.

(21) Appl. No.: 13/782,253

(22) Filed: Mar. 1, 2013

(65) Prior Publication Data

US 2013/0229154 A1    Sep. 5, 2013

(30) Foreign Application Priority Data

Mar. 2, 2012  (FR) ................................. 12 51925

(51) Int. Cl.
*H02J 7/00* (2006.01)
*G01N 27/416* (2006.01)
*G08B 21/00* (2006.01)
*G01R 21/06* (2006.01)
(Continued)

(52) U.S. Cl.
CPC .......... *G01R 31/3606* (2013.01); *G01R 31/361* (2013.01); *G01R 31/3634* (2013.01);
(Continued)

(58) Field of Classification Search
CPC ............... Y02E 60/12; G01R 31/3648; G01R 31/3651; G01R 31/3624; G01R 31/3606; G01R 31/3675; G01R 31/008; G01R 31/343; G01R 31/3662; G01R 21/133; H02J 7/0047; H02H 3/006; H02H 3/042; H01R 13/641; G01D 4/004; Y02B 90/242; Y04S 20/322; G06Q 50/06

USPC ........ 320/132; 324/427, 433; 340/635, 636.1, 340/636.12, 636.19, 636.2; 702/62, 63
See application file for complete search history.

(56) References Cited

U.S. PATENT DOCUMENTS

| | | |
|---|---|---|
| 6,515,453 B2 | 2/2003 | Feil et al. |
| 2007/0170893 A1* | 7/2007 | Kao ................... G01R 31/3651 320/132 |
| 2010/0036627 A1* | 2/2010 | Bergveld ........... G01R 31/3651 702/63 |

FOREIGN PATENT DOCUMENTS

| | | |
|---|---|---|
| FR | 2942882 A1 | 9/2010 |
| WO | 2006/058970 A1 | 6/2006 |
| WO | 2010/140044 A1 | 12/2010 |

OTHER PUBLICATIONS

European Search Report issue in European Patent Application No. 13156838 dated May 22, 2013.

(Continued)

*Primary Examiner* — Richard Isla Rodas
*Assistant Examiner* — Mohammed J Sharief
(74) *Attorney, Agent, or Firm* — Sughrue Mion, PLLC

(57) ABSTRACT

A method and system are provided for estimating state of charge of a cell having a positive electrode, for example of a lithium phosphate type, the charge profile of which includes a range of state of charge between about 30 and about 90% in which variation of voltage is 10 times less rapid than for a state of charge higher than 90%. Determination of state of charge for a state of charge greater than 90% is based on either the use of a calibration relationship between cell voltage and state of charge when a current is passing through the cell that is less than a predetermined threshold value and its voltage has stabilized, or on the use of coulometry the result of which is corrected taking into account the accuracy of the current sensor.

18 Claims, 12 Drawing Sheets

(51) Int. Cl.
　　　*G01R 31/36*　　(2006.01)
　　　*H01M 10/48*　　(2006.01)
　　　*H01M 4/58*　　　(2010.01)
　　　*H01M 10/052*　　(2010.01)

(52) U.S. Cl.
　　　CPC ........ *G01R31/3651* (2013.01); *G01R 31/3665* (2013.01); *H01M 10/48* (2013.01); *H01M 4/5825* (2013.01); *H01M 10/052* (2013.01)

(56) References Cited

OTHER PUBLICATIONS

French Preliminary Search Report for FR 12 51 925, dated Nov. 30, 2012.
Written Opinion of the French Preliminary Search Report of FR 12 51 925, dated Mar. 2, 2012.

* cited by examiner

METHOD AND SYSTEM FOR ESTIMATING STATE OF CHARGE OF A LITHIUM ELECTROCHEMICAL CELL HAVING A LITHIUM PHOSPHATE TYPE POSITIVE ELECTRODE

TECHNICAL FIELD

The present invention relates to the technical field of methods of estimating state of charge of an electrochemical cell for which measurement of its voltage does not always make it possible to accurately estimate state of charge. Such a cell typically has a charge profile that includes at least one area in which voltage does not continuously vary proportionally to state of charge. The invention also relates to electronic systems for implementing such methods for estimating state of charge of the cell.

STATE OF THE ART

An electrochemical cell or secondary cell (generally referred to hereinafter by the term "cell") is a device for generating electricity in which chemical energy is converted into electrical energy. The chemical energy is constituted by electrochemically active compounds deposited on at least one side of electrodes arranged in the cell. Electrical energy is generated by electrochemical reactions during discharge of the cell. Electrodes, arranged in a container, are electrically connected to output terminals for current providing electrical continuity between the electrodes and an electrical load to which the cell is associated.

Typically a battery comprises a plurality of cells adapted to be combined into a single container. A battery may be divided into modules, each module being composed of a plurality of cells interconnected in series and/or parallel. The battery is designed to supply electric power to an external application. A charging circuit is generally provided to which the battery can be connected in order to charge the cells. A management system including measurement sensors and an electronic control circuit of a greater or lesser degree of sophistication depending on the application for which the battery is intended can be included.

It is known from EP-A-2144075, EP-A-2239826 and EP-A-2309615 to use as a positive electrode material lithium phosphates of at least one transition metal notably $LiMPO_4$ type compounds where M is selected from the group consisting of Fe, Co, Ni, Mn and a mixture thereof. These lithium phosphates exhibit better thermal stability than the lithium-containing oxides of transition metals of the $LiM^1O_2$ type conventionally used in lithium cells, in which $M^1$ represents at least one transition element selected generally from Co, Ni and Fe. The use of lithium phosphate therefore reduces the risk of violent reactions should the battery be placed in a state of overcharge.

It is also known to use as an active ingredient a mixture comprising $LiMPO_4$ and compound of the $LiM^1O_2$ type where $M^1$ is at least one transition element generally chosen from Co, Ni, Fe, Mn and Al. In particular, EP-A-2,269,954 discloses an electrochemically active material which is a mixture comprising:

a) less than 10% by weight of a lithium-containing oxide of transition metals containing at least nickel, cobalt and aluminum, and b) at least 90% by weight of lithium phosphate with at least one transition metal, whose surface is at least partially covered with a layer of carbon. This type of active ingredient is a good compromise between high capacity and thermal stability.

In cells in which the positive electrode comprises an electrochemically active material of lithium phosphate or of the type described in EP-A-2,269,954, cell voltage varies only very slightly depending on state of charge for a state of charge between about 30 and about 90%. It will be recalled that state of charge (SOC) is determined as the amount of energy available in the battery relative to the energy of a fully charged battery. It is expressed as a percentage and reflects the amount of energy remaining available to the user. In this type of cell, variation of open circuit voltage as a function of state of charge exhibits a region of state of charge between about 30 and about 90% where open circuit voltage increases on average at least 10 times less rapidly as a function of state of charge than it does for a state of charge between 90% and 100%.

Open circuit voltage is the voltage measured across the cell when it is not delivering any current. Open circuit voltage is defined in this way according to definition 482-03-32 of IEC standard 60050-482: 2004, International Electrotechnical Vocabulary Part 482: Electrical batteries and accumulators.

By variation in voltage according to state of charge, we mean either the derivative of voltage with respect to state of charge, or the ratio $\Delta V/\Delta SOC=(V2-V1)/(SOC2-SOC1)$ where V1 and V2 are voltage values of two points on the curve of voltage as a function of state of charge, and SOC2 and SOC1 represent states of charge corresponding to voltage values V2 and V1.

For example, a cell with a positive electrode comprising an electrochemically active material of lithium iron phosphate $LiFePO_4$ type charged at a current of C/5 amperes exhibits a voltage which increases at about 0.5 millivolt per minute for a state of charge between 30 and 90%, and increases at about 20 millivolts per minute for a state of charge between 90% and 100%, C being the nominal capacity of the cell. Due to this very small voltage variation, it is difficult to accurately estimate state of charge of the cell according to its voltage when state of charge is between about 30 and 90%.

FIG. 1 schematically shows the charge profile (PC) for a cell the positive electrode of which comprises an electrochemically active material of the type described in EP-A-2, 269,954.

Three main areas are shown:

Zone 1: corresponds to a voltage less than or equal to VmaxZone1. A voltage value VmaxZone1 corresponds to a state of charge value equal to MinSOCZone2. VmaxZone1 is generally between 3 and 3.30 V and is typically 3.30 V. State of charge value MinSOCZone2 is generally in the range of 15 to 30%, typically 30%. In Zone 1, voltage varies almost proportionally with state of charge, that is to say, to a given cell voltage there corresponds a given state of charge. Zone 1 can be further subdivided into a first area for state of charge between 0 and less than 10%, where the cell voltage varies by more than 300 mV and a second area of state of charge typically comprised between 10% and, typically, 30%, where voltage varies more slowly depending on state of charge, for example, about 100 mV for an increase in state of charge of 20%.

Zone 23: corresponds to a voltage greater than VmaxZone1 and below VminZone4. VminZone4 is generally between 3.35 and 3.45V, and is typically 3.40 V. To value VminZone4 there corresponds a state of charge value equal to MaxSOC-Zone3. This state of charge value MaxSOCZone3 is generally in the range of 80 to 95%, typically 90%. Zone 23 typically corresponds to the region of voltage between 3.30 V and 3.40 V corresponding to a state of charge typically between 30% and 90%. We can note a variation of cell voltage which is close to zero for a state of charge between 30% and 60% and for a state of charge between 65% and 90%. In Zone 23, voltage of the cell varies little, typically of the order of 100 mV for a state of charge between about 30 and about 90%. The result is a very inaccurate measurement of state of charge in Zone 23 since a certain voltage value may correspond to a state of charge within a wide range of from 30 to 90%. Zone 23 can be sub-divided into two sub-areas as shown in FIG. 2 which is an enlargement of FIG. 1: a first sub-area: Zone 2 from MinSOCZone2 to MaxSOCZone2, in other words from 30 to 60% and a second sub-area, Zone 3 from MinSOCZone3 to MaxSOCZone3, i.e. from 65 to 90%. Zones 2 and 3 meet round about a state of charge between 60 and 65%.

Zone 4: corresponds to a voltage greater than or equal to VminZone4. To value VminZone4 there corresponds a state of charge equal to MaxSOCZone3. VminZone4 corresponds to a state of charge of about 90%. In this area, voltage varies proportionally with state of charge. It varies by about at least 300 mV. To a given voltage of the cell, there corresponds a given state of charge.

This charge profile is common for $LiMPO_4$ type compounds where M is selected from the group consisting of Fe, Co, Ni, Mn and a mixture thereof.

In Zone 1, variation of cell voltage as a function of state of charge for a state of charge less than MinSOCZone2 corresponding to VmaxZone1 is on average at least twice as rapid as voltage variation for a state of charge between MinSOCZone2 and MaxSOCZone3.

There is currently no method which can be adapted to satisfactorily estimate state of charge of an electrochemical cell of which the positive electrode comprises an electrochemically active material of the lithium phosphate type or of the type described in EP-A-2,269,954. There is a need for a system and a method for estimating state of charge for this type of cell.

There is consequently a need for a method making it possible to accurately determine state of charge of a cell having a charge profile of the type described above.

SUMMARY OF THE INVENTION

To this end, the present invention provides a method of estimating state of charge (SOC) of a cell (E) comprising an electrode comprising an electrochemically active material having a charge profile (PC) for which, for a state of charge between about 30% and about 90%, voltage increases at least 10 times less rapidly with time on average than it does for a state of charge higher than 90%. This method applies to the management of state of charge of a cell comprising a positive electrode of lithium phosphate or of the type described in EP-A-2,269,954. The method consists in managing state of charge in a manner optimized for areas of charge in the charge profile (PC) which are defined by voltage and state of charge limits.

More particularly, the invention provides a method for estimating state of charge (SOC) of an electrochemical cell (E) comprising an electrode comprising an electrochemically active material having a charge profile (PC) in which variation of voltage as a function of state of charge between a state of charge higher than a value MinSOCZone2 of state of charge corresponding to a predetermined voltage VmaxZone1 and a state of charge less than a value MaxSOCZone3 corresponding to a predetermined voltage VminZone4 is, on average, at least 10 times less rapid than variation in voltage for a state of charge greater than MaxSOCZone3, said method comprising the steps of:

a) providing a cell; connecting said cell to a device for charging or discharging it and measuring a current I through the cell; providing a calibration relationship between state of charge of the cell and voltage;

b) providing an initial state of charge $SOC(t_0)$ of said cell at an initial time $t_0$;

c) measuring cell voltage $V(t_n)$ of said cell (E) and determining an adjusted state of charge $SOC(t_n)$ of said cell at a point in time $t_n$ later than $t_0$ when $V(t_n)$ is greater than or equal to said voltage VminZone4, under the following conditions:

i) if a current $I(t_n)$ lower in absolute value than a predetermined current threshold value Ithreshold has been passing through said cell for longer than a predetermined value t_Zone4, then a value $SOCV(t_n)$ is determined from said calibration relationship of voltage as a function of state of charge, and said value $SOCV(t_n)$ is assigned to $SOC(t_n)$ and a zero value is assigned to a parameter corresponding to a cumulative error in state of charge obtained by coulometry ErreurcumuléeSOCC($t_n$);

ii) otherwise a value $SOCC(t_n)$ determined by coulometry is assigned to $SOC(t_n)$ and a cumulative measurement error ErreurcumuléeSOCC($t_n$) of the measurement of state of charge $SOCC(t_n)$ of said cell between time $t_0$ and time $t_n$ is determined.

The method makes it possible to accurately determine state of charge of the cell when the latter is between 90 and 100%. It therefore makes it possible to prevent overcharging of the cell.

According to one embodiment, the charge profile (PC) further comprises an area in which variation of voltage of the cell E as a function of state of charge for a state of charge less than a value MinSOCZone2 corresponding to a voltage VmaxZone1 is on average at least twice as rapid as variation in voltage for a state of charge between values of MinSOCZone2 and MaxSOCZone3 and step c) further comprises determining an adjusted state of charge $SOC(t_n)$ of the cell E at a time $t_n$ greater than $t_0$, when cell voltage $V(t_n)$ is less than or equal to said voltage VmaxZone1, under the following conditions:

i) if a current $I(t_n)$ lower in absolute value than a predetermined current threshold value Ithreshold' has been passing through said cell for a period of time greater than a predetermined period of time t_Zone1, then a value $SOCV(t_n)$ is determined from said calibration relationship of voltage as a function of state of charge SOC, said value $SOCV(t_n)$ is assigned to $SOC(t_n)$ and a value of zero is assigned to a parameter corresponding to cumulative error in state of charge obtained by coulometry ErreurcumuléeSOCC($t_n$);

ii) otherwise a value $SOCC(t_n)$ determined by coulometry is assigned to $SOC(t_n)$ and a cumulative measurement error ErreurcumuléeSOCC($t_n$) in measurement of state of charge $SOCC(t_n)$ of the cell E between time $t_0$ and time $t_n$ is determined.

This embodiment makes it possible to accurately determine state of charge of the cell when the latter is between 0 and 30%, preferably between 0 and 10%. It therefore avoids the risk of excessive discharge of the cell.

According to one embodiment, the charge profile for a state of charge between MinSOCZone2 and MaxSOCZone3 exhibits:

a first sub-area ranging from MinSOCZone2 to a value of state of charge MaxSOCZone2; MaxSOCZone2 being a value corresponding to a predetermined voltage value VmaxZone2;

a second sub-area ranging from a value of state of charge MinSOCZone3 to a value of state of charge MaxSOCZone3; said value of state of charge MinSOCZone3 corresponding to a predetermined voltage value VminZone3; and step c) further comprises assigning a value $SOC(t_n)$ to the cell E at a point in time $t_n$ greater than $t_0$ when cell voltage $V(t_n)$ of said cell is greater than VmaxZone1 and less than VminZone4, under the following conditions:

i) if the cell E is being traversed by a current $I(t_n)$ lower in absolute value than a predetermined threshold current value equal to min(Ithreshold, Ithreshold') for a period of time greater than a predetermined value t_Zone23, value assigning is performed under the following conditions:

If $SOCC(t_n)$>MaxSOCZone3 then the value MaxSOCZone3 is assigned to $SOC(t_n)$ and the value ($SOCC(t_n)$–MaxSOCZone3) is subtracted from the cumulative error in state of charge value determined by coulometry;

If $SOCC(t_n)$<MinSOCZone2 then the value MinSOCZone2 is assigned to $SOC(t_n)$ and the value (MinSOCZone2–$SOCC(t_n)$) is subtracted from the cumulative error in state of charge determined by coulometry;

If $V(t_n)$<VmaxZone2 and if $SOCC(t_n)$>MaxSOCZone2 then the value MaxSOCZone2 is assigned to $SOC(t_n)$ and the value ($SOCC(t_n)$–MaxSOCZone2) is subtracted from the cumulative error in state of charge determined by coulometry;

If $V(t_n)$>VminZone3 and if $SOCC(t_n)$<MinSOCZone3 then MinSOCZone3 is assigned to $SOC(t_n)$ and the value (MinSOCZone3–$SOCC(t_n)$) is subtracted from the cumulative error in state of charge determined by coulometry;

ii) otherwise a state of charge $SOCC(t_n)$ determined by coulometry is assigned to $SOC(t_n)$ and a cumulative measurement error ErreurcumuléeSOCC($t_n$) in measurement of state of charge $SOCC(t_n)$ of the cell E at time $t_0$ is determined.

This embodiment makes it possible to perform partial adjustment of state of charge when cell voltage of the cell is in zone 23 of the charge profile (the so-called "flat" area of charge profile).

According to one embodiment, state of charge of the cell E is estimated at a time $t_{n+1}$ greater than $t_n$ under the following conditions:

if condition c) i) is satisfied at time $t_n$, then an initial state of charge (SOC $t_0$) is reset by assigning the value SOCV($t_n$) thereto and steps b) and c) are performed with $t_0=t_n$ and $SOCC(t_{n+1})=\Delta SOCC(t_{n+1}-t_n)+SOC(t_n)$;

if condition c) ii) is satisfied, then $SOCC(t_{n+1})=\Delta SOCC(t_{n+1}-t_n)+SOC(t_n)$;

wherein $\Delta SOCC(t_{n+1}-t_n)$ is variation of state of charge of said cell E determined by coulometry between times $t_n$ and $t_{n+1}$.

According to one embodiment, error in state of charge obtained by coulometry $\Delta$ErreurSOC between times $t_n$ and $t_{n+1}$ is:

$$\Delta ErreurSOC(\%) = 100 \times \frac{\left[ErreurIOffsetSOC + \frac{(ErreurIGain \times Abs(I))}{100}\right] \times (t_{n+1} - t_n)}{3600 \times C}$$

with:

ErreurIOffsetSOC: offset error of the current measuring device expressed in amperes;

ErreurIGain: gain error of the current measuring device as a a percentage of measured current;

Abs (I): absolute value of the current I flowing through the cell expressed in amperes;

C: capacity of the cell expressed in ampere-hours;

$t_{n+1}-t_n$ is the elapsed time between two updates of state of charge, expressed in seconds.

According to one embodiment, the method includes calculating at time $t_{n+1}$ cumulative error in state of charge since adjustment of state of charge at previous point in time $t_n$ using the following relationship:

$$ErreurcumuléeSOC(t_{n+1})(\%) = ErreurcumuléeSOC(t_n) + \Delta ErreurSOC(t_{n+1})$$

where

ErreurcumuléeSOC($t_{n+1}$) is updated cumulative error in state of charge at time $t_{n+1}$ resulting from measurement error in the current sensor;

ErreurcumuléeSOC($t_n$) is the value of cumulative error at the previous measurement time $t_n$, and ErreurcumuléeSOC($t_0$)=0.

According to one embodiment, the method includes, after step c) ii) one of the following steps of:

α) assigning to state of charge $SOC(t_n)$ a predetermined value SOCsup, preferably between 90% and 100% if, firstly, $SOC(t_n)$ is greater in value than the value of state of charge SOCsup and if, secondly, cell voltage under charge $V(t_n)$ is below a predetermined threshold voltage value Vs1 for a predetermined time t6, or β) assigning to state of charge $SOC(t_n)$ a predetermined value SOCinf, preferably less than 10% if, firstly, $SOC(t_n)$ is less than the value of state of charge SOCinf and if, secondly, cell voltage under discharge $V(t_n)$ is higher than a predetermined threshold voltage value Vs2 for a predetermined time t7.

According to one embodiment, the method includes, after step c) ii) the following step of:

γ) assigning to state of charge $SOC(t_n)$ a value of 0% if, firstly the value of $SOC(t_n)$ is less than a safety threshold value of state of charge SOCminsafe, for example 20%, and if, secondly, the value of cell discharge voltage $V(t_n)$ is lower than a predetermined voltage value Vminsafe for a predetermined time t8.

According to one embodiment, the method includes interrupting charging or discharge of the cell when cumulative error ErreurcumuléeSOCC($t_n$) of said cell E exceeds a predetermined threshold value and/or sending a warning message to a user.

According to one embodiment, the method includes measuring a temperature of the cell E and increasing the values of Ithreshold and Ithreshold' when cell temperature has increased.

According to one embodiment, the method includes measuring a temperature of the cell E and decreasing the values of t_Zone4, t_Zone1 and t_Zone23 when cell temperature has increased.

According to one embodiment, the values of t_Zone4, t_Zone1 and t_Zone23 are adjusted as a function of cell temperature by decreasing said values when cell temperature has increased.

According to one embodiment, the values of VminZone4 and VmaxZone1 are corrected to take account of internal resistance r of the cell E, said correction consisting in adding to VminZone4 and VmaxZone1 a quantity $r \times I(t_n)$, where $I(t_n)$ is negative when the cell is in discharge and positive when the cell is being charged.

This method provides the most accurate adjustment strategy as a function of cell voltage compared to predetermined voltage values VmaxZone1 to VminZone4 and dependent on whether the cell is under quiescent current conditions or is on charge or under discharge. When voltage is within Zone 1 or Zone 4 and the cell is under quiescent current conditions or is under charge or discharge at a current lower in absolute value than a predetermined threshold value and voltage has a value which is stable over time, state of charge of the cell is adjusted by assigning thereto a value previously obtained by calibration of voltage of the cell as a function of its state of charge. This calibration is performed beforehand in the laboratory on an individual cell and consists in matching a given voltage across the cell to a state of charge. This calibration can be done for example by determining the open circuit voltage of the cell as a function of its state of charge.

In cases where:
the cell is under quiescent current conditions but its voltage is not stabilized or
the cell is under charge or discharge at a current lower in absolute value than a predetermined threshold value but its voltage has not stabilized, or
the current flowing through the cell is greater in absolute value than the predetermined current threshold value,
then the method determines state of charge of the cell by coulometry taking into account measurement uncertainty in the current sensor.

The invention also provides a system for estimating state of charge of at least one electrochemical cell (E) having a charge profile (PC) in which variation of voltage as a function of state of charge between a state of charge higher than a value MinSOCZone2 of state of charge corresponding to a predetermined voltage VmaxZone1 and a state of charge less than a value of state of charge MaxSOCZone3 corresponding to a predetermined voltage VminZone4 is, on average, at least 10 times less rapid than variation in voltage for a state of charge greater than MaxSOCZone3, said system comprising:
a) means for measuring a current I flowing through the cell;
b) means for measuring voltage V of the cell;
c) an electronic data management system G for the cell, including a computer configured to:
calculate state of charge of the cell E by coulometry;
perform estimation of state of charge of the cell E according to the above method.

According to one embodiment, the system further comprises means for storing a state of health SOH of said cell.

The invention also provides an assembly comprising:
the above system;
at least one cell (E) having a charge profile (PC) in which variation of voltage as a function of state of charge between a state of charge higher than a value of state of charge MinSOCZone2 corresponding to a predetermined voltage VmaxZone1 and a state of charge less than a value MaxSOCZone3 corresponding to a predetermined voltage VminZone4 is, on average, at least 10 times less rapid than variation in voltage for a state of charge greater than MaxSOCZone3.

According to one embodiment, the cell comprises a positive electrode containing:
either a compound a) of formula $Li_xM_yP_zO_{4-t}$ wherein M is selected from the group consisting of Fe, Co, Ni, Mn, Al and mixtures thereof, x ranges from 0.9 to 1.1 and y from 0.9 to 1.1, z from 0.9 to 1.1 and t ranging from 0 to 0.4, where M is preferably Fe or a mixture of Fe and Mn;
or a mixture b) of compound a) with a lithium-containing oxide of formula $LiM^1O_2$ wherein $M^1$ denotes at least one element selected from Co, Ni, Mn, Al and Fe, or a mixture thereof.

According to one embodiment, the electrochemically active material is selected from a composition comprising:
at least 50% by weight of compound a);
less than 50% by weight of a lithium-containing oxide of formula $LiM^1O_2$ wherein $M^1$ denotes at least one element selected from Co, Ni, Mn, Al and Fe, or a mixture thereof.

According to one embodiment, the composition comprises:
at least 90% by weight of compound a), a surface of which is preferably at least partially covered by a layer of carbon;
10% or less by weight of the lithium-containing oxide of the formula $LiM^1O_2$.

The invention also provides a computer program product that includes at least one sequence of stored instructions accessible to a processor, wherein processor execution leads to the implementation of the steps of the method set out above.

The invention also provides a computer-readable data carrier allowing implementation of at least one of the sequences of instructions of the above computer program product.

BRIEF DESCRIPTION OF THE DRAWINGS

FIG. 9a shows variation of current through the cell, the latter being subjected to repeated cycles comprising charging with a current of 40 A followed by discharging at a current of 40 A.

FIG. 10a shows discharge current as a function of time.

FIG. 10b shows variation of voltage across the cell as a function of time.

FIG. 10c shows variation of cell temperature versus time.

FIG. 10d shows variation of state of charge as a function of time and resetting to zero of state of charge when the latter falls below 20%.

DETAILED DESCRIPTION OF PREFERRED EMBODIMENTS

A) System for Estimating State of Charge:

The system according to the invention comprises at least one cell (E) having a charge profile (PC) in which variation of voltage as a function of state of charge in an area between a state of charge greater than a state of charge equal to MinSOCZone2 and less than a state of charge equal to MaxSOCZone3 is on average at least 10 times less rapid than variation of voltage for a state of charge greater than MaxSOCZone3. The system may include several cells connected together in any desired series or parallel configuration. Some cells can be grouped together in a single container to form a module.

Figure 3:
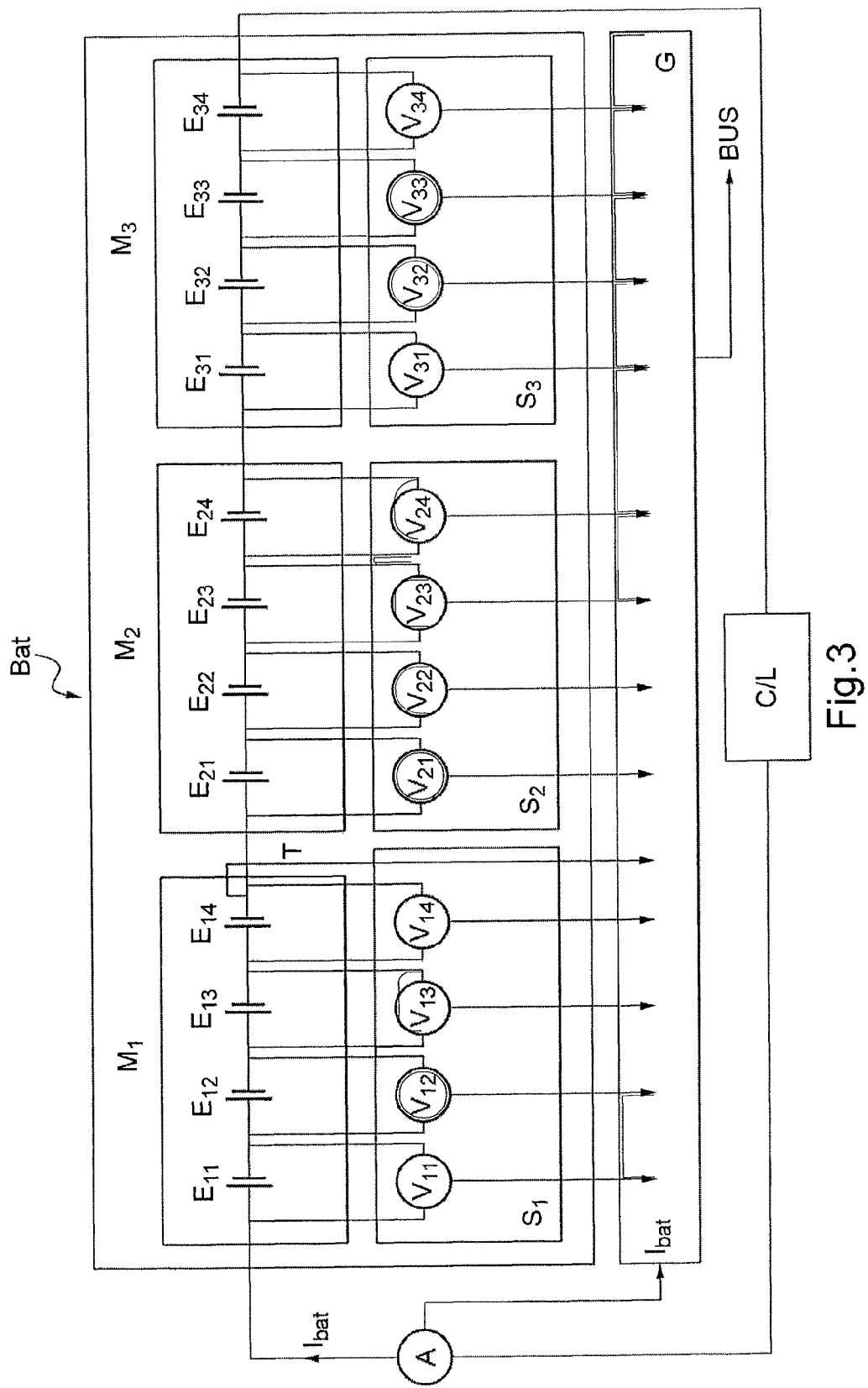
FIG. 3 shows a schematic diagram of the management system G for state of charge of a battery in which a battery (Bat) comprises three modules (M1, M2, M3), each comprising four electrochemical cells (E11, E12, E13, E14, E21, E22, E23, E24, E31, E32, E33, E34).

FIG. 3 is an example of a configuration in which four electrochemical cells (E11, E12, E13 and E14) are connected in series and arranged together in the same container to form a first module (M1). Similarly, four cells (E21, E22, E23 and E24) are connected in series and arranged in a second container to form a second module (M2); four cells (E31, E32, E33 and E34) are connected in series and arranged in a third container to form a third module (M3). The three modules M1, M2 and M3 are connected in series to form a battery (Bat). The three modules constitute one branch of the circuit. Of course, FIG. 3 is only an example of an application and each module may include a number of cells which is not necessarily limited to four. The cells are not necessarily connected in series but can also be connected in parallel. It is also possible to connect cells together in parallel in order to obtain several combinations of cells in parallel, and then connecting these combinations of cells in series. Similarly, the battery may include any number of modules in a configuration that is not necessarily limited to a series connection. For example, the battery may include p parallel branches, each parallel branch including at least one cell or at least one module.

The branches of the battery are connected to a current source (C) which may be a charger or an application that provides an unregulated charging current as is the case in a hybrid vehicle during braking in which energy is converted into mechanical power. The current source provides a current that. If the battery has p identical branches in parallel, then the current through each branch is Ibat/p. In the example of FIG. 3, one single branch is shown. The same current equal to that is flowing through the modules and cells. Means for measuring current (A), such as a Hall sensor, measure the current that. The battery may be discharged through an application (L) connected across the battery.

Each cell is provided with means for measuring voltage across its terminals. Preferably, one cell is also provided with means for measuring its operating temperature. This measuring means is placed at a point suitably selected on the cell to provide a representation of its mean and/or maximum and/or minimum temperature. If the battery comprises a plurality of cells, each cell can be provided with a temperature sensor, but this makes the electronic circuits more complex.

In the case of modules comprising a number of cells, the means for measuring voltage and temperature can be grouped together within an electronic system (Si), associated with a module M1. In FIG. 3, the electronic systems (S1, S2, S3) are respectively associated with the modules (M1, M2 and M3). Each electronic system may also include a memory for storing the aging status of the cells or module. The state of aging of a cell can be characterized by the parameter SOH ("State of Health"), which indicates the degree of aging of the cell between a new and a dying state. The skilled person has several techniques at his disposal making it possible to calculate the aging status of a cell or a module. The aging status of a cell can for example be calculated either from the ratio of the impedance of the cell at a given time to the impedance of the cell when new at the same temperature, or from an estimate of capacity loss as compared with the capacity of the cell in the new state.

The system makes it possible to determine state of charge of each cell individually. It includes an electronic management system G comprising a computer for:
 collecting measurements of current I flowing through each cell;
  collecting measurements of the voltage of each cell and optionally temperature measurements;
  calculating state of charge SOC of each cell by coulometry taking into account measurement error on the value of current;
  carrying out estimation of state of charge of each cell according to the method of the invention.

Preferably, the system has at least one communication bus (BUS), for example (CAN "Control Area Circuit", Ethernet) to provide information about the state of the cell or of the battery to a user.

Preferably, the computer collects the state of health of the cells (or modules).

The system according to the invention is adapted to estimate state of charge of cells whose positive active material has a charge profile wherein voltage variation as a function of state of charge between a state greater than a value MinSOCZone2 corresponding to a predetermined voltage VmaxZone1 and a state of charge less than MaxSOCZone3 corresponding to a predetermined voltage VminZone4 is on average at least 10 times less rapid, preferably at least 20 times less rapid, than variation in voltage for a state of charge greater than MaxSOCZone3.

Preferably, the positive active material comprises $Li_xM_yP_zO_{4-t}$ type lithium metal phosphate wherein M is selected from the group consisting of Fe, Co, Ni, Mn and Al, x ranging from 0.9 to 1.1, y ranging from 0.9 to 1.1, z from 0.9 to 1.1 and t ranging from 0 to 0.4, preferably where M is Fe or a mixture of Fe and Mn. We shall symbolize this material by $LiMPO_4$.

The active material can also be a mixture comprising $LiMPO_4$ and a compound $LiM'O_2$ where $M^1$ represents at least one transition element generally selected from Co, Ni, Fe, Mn and Al. Preferably, this mixture comprises:
- at least 50% by weight of $LiMPO_4$;
- less than 50% by weight of a lithium-containing oxide of formula $LiM^1O_2$.

In particular, the mixture may be as described in EP 2,269, 954 A, that is to say, comprise:
a) a lithium-containing oxide of transition metals containing at least nickel, cobalt and aluminum;
b) a lithium-containing phosphate of at least one transition metal, the surface of which is at least partially covered with a layer of carbon,
  the proportion by weight of lithium-containing oxide of the transition metal containing at least nickel, cobalt and aluminum being less than or equal to 10% by weight of the composition.
  the proportion by weight of lithium-containing phosphate of at least one transition metal being greater than or equal to 90% by weight of the composition.

The negative electrode may include a carbonaceous material capable of inserting lithium into its structure, for example based on graphite, or a compound of the type $Li_4Ti_5O_{12}$.

B) Description of the Method of Estimating State of Charge:

The principle of adjusting the state of charge of a "flat profile" cell depends in particular on the area or zone in which its voltage is situated. As explained before, charge profile comprises three areas or zones of voltage:
Zone 4: an area where voltage is higher than or equal to VminZone4 corresponding to a state of charge higher than or equal to about 90%;
Zone 1: an area in which voltage is less than or equal to VmaxZone1 corresponding to a state of charge less than or equal to about 30%;
Zone 23: an area where voltage is greater than VmaxZone1 and below VminZone4 which corresponds to a state of charge between about 30 and 90%. Zone 23 can itself be divided into two sub-areas separated by a portion in which voltage increases substantially more with state of charge than in these two sub-areas.

Figure 4:
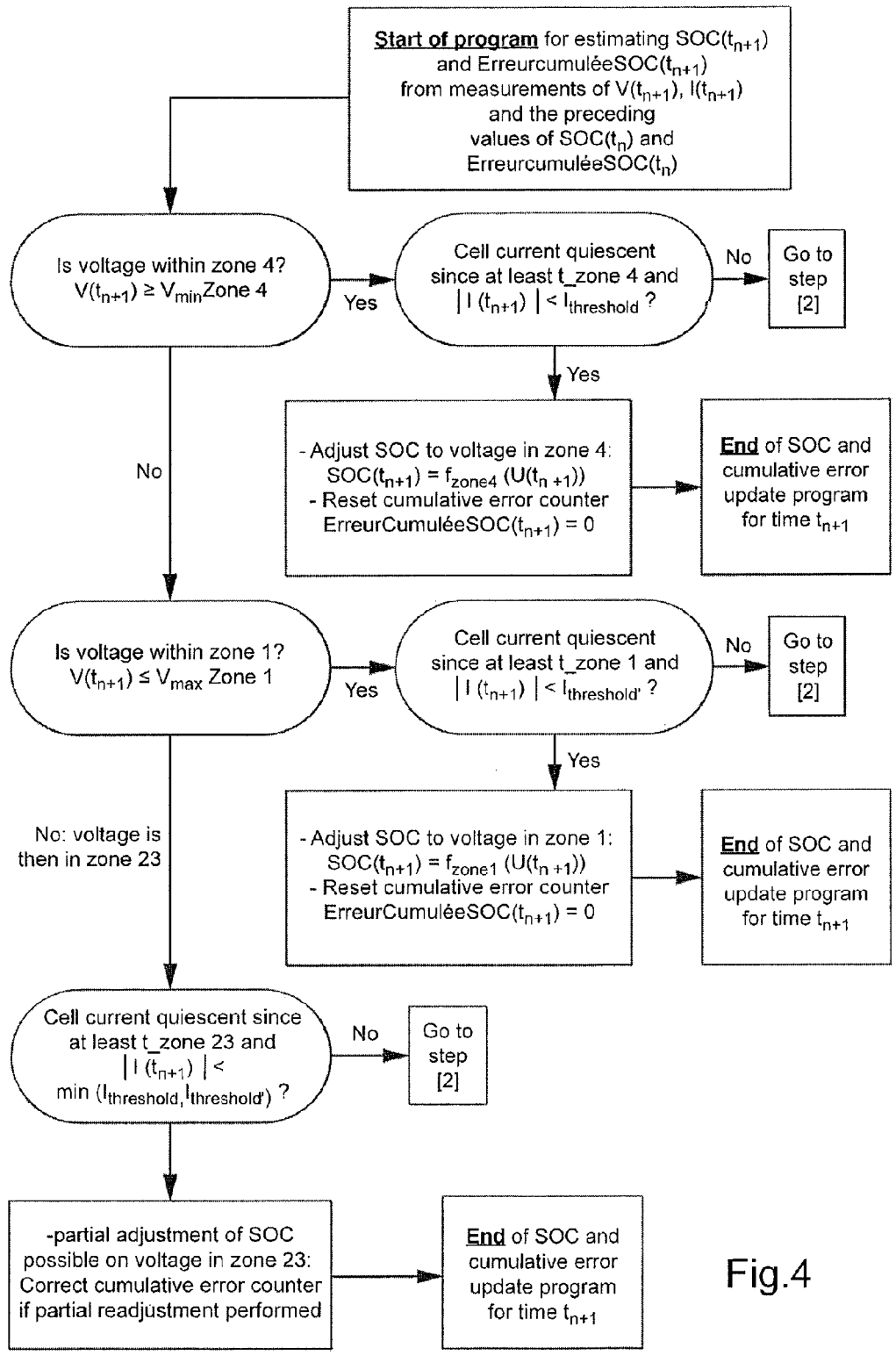
FIG. 4 shows a flowchart illustrating the principle of adjusting state of charge of the cell in the following three situations:
Voltage of the cell is in Zone 4. The cell is "under quiescent current conditions", that is to say, it is traversed by a current of less than Ithreshold;
Voltage of the cell is situated in Zone 1. The cell is "under quiescent current conditions", that is to say, it is traversed by a current less than Ithreshold';
Voltage of the cell is situated in Zone 23. The cell is "under quiescent current conditions", that is to say, it is traversed by a current of less than min(Ithreshold, Ithreshold')
Figure 5:
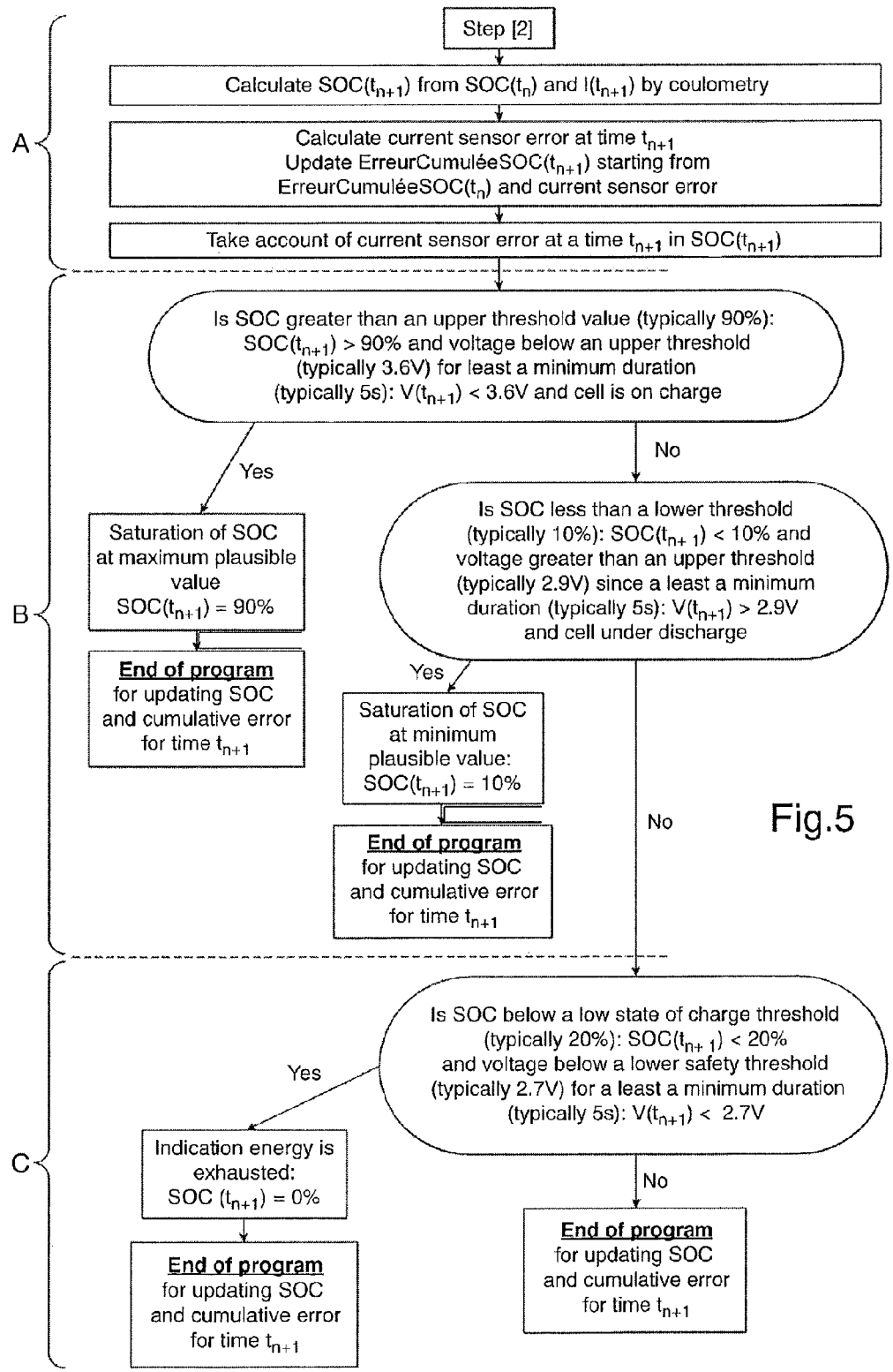
FIG. 5 is a flowchart summarizing the principle of adjusting state of charge of the cell when the operating mode of the cell does not correspond to any of the situations illustrated in FIG. 4. State of charge is then determined by the technique of coulometry taking into account measurement error in the current sensor (Set A). This chart also shows schematically adjustment of state of charge in the following two situations:
Reduction of state of charge to 90% or increase of state of charge by 10% (Set B);
detection of a low safety threshold of 20% (Set C).

The principle of adjusting state of charge is summarized by the flow charts in FIGS. 4 and 5. All possible steps for controlling all parameters have been shown. Nevertheless, it is possible for the method to only perform part of the steps. Indeed, the method performs at least the control of state of charge when voltage of the cell is in Zone 4. Preferably, it performs control of state of charge when voltage of the cell is in Zone 1 or Zone 23.

I) Adjustment of State of Charge of a Cell when its Voltage is in Zone 4 or Zone 1:

Ia) If, firstly, the cell E at time $t_n$ is "under quiescent current conditions", that is to say, it is being used in charge or discharge at a current lower in absolute value than a predetermined threshold value, and, secondly, if its voltage is stable over time, state of charge of the cell is adjusted by assigning a value $SOCV(t_n)$ obtained by calibrating voltage of the cell as a function of its state of charge. This calibration is performed first on a laboratory cell alone and consists in mapping a given voltage V across the cell E to a given state of charge SOC. This calibration is performed preferably by determining the open circuit voltage of the cell as a function of its state of charge.

A cell under quiescent current conditions defined for zero current is taken in this invention in a broad sense. Indeed, a cell is mostly connected to an electrical circuit and thus, once connected to the circuit, the current through it is never zero. We can then define a threshold current below which the cell is "under quiescent current conditions". In what follows, we denote by the term cell "under quiescent current conditions" a cell through which a current lower in absolute value to Ithreshold when its voltage is in Zone 4 is passing, or a current lower in absolute value than Ithreshold' is passing when its voltage is in Zone 1, or a current lower in absolute value than min(Ithreshold, Ithreshold') is passing when its voltage is in Zone 23.

Ithreshold and Ithreshold' can be for example defined as the ratio between the accuracy of the voltage sensor used for measuring voltage across the cell and internal resistance r of the cell. For example, if the accuracy of the measurement voltage is 10 mV and internal resistance of the cell is 2 mOhm then we obtain a value of 5 A for Ithreshold or Ithreshold'.

Ithreshold and Ithreshold' may also be defined as an open circuit voltage difference for a predetermined variation in state of charge, for example between 2 and 10%, divided by internal resistance of the cell. If, for example in Zone 4, we consider an open circuit voltage variation of 300 mV for 5% variation in state of charge (between 90% and 95% of SOC) and internal resistance of the cell is measured to be 2 mOhm then we can define Ithreshold=300/2=150 A. For Zone 1 (less steep), if we consider a variation of open circuit voltage of 50 mV for 5% variation in state of charge (average voltage variation between 0% and 30% SOC) and internal resistance of the cell is measured as 2 mOhm then we can define Ithreshold'=50/2=25 A.

Figure 6:
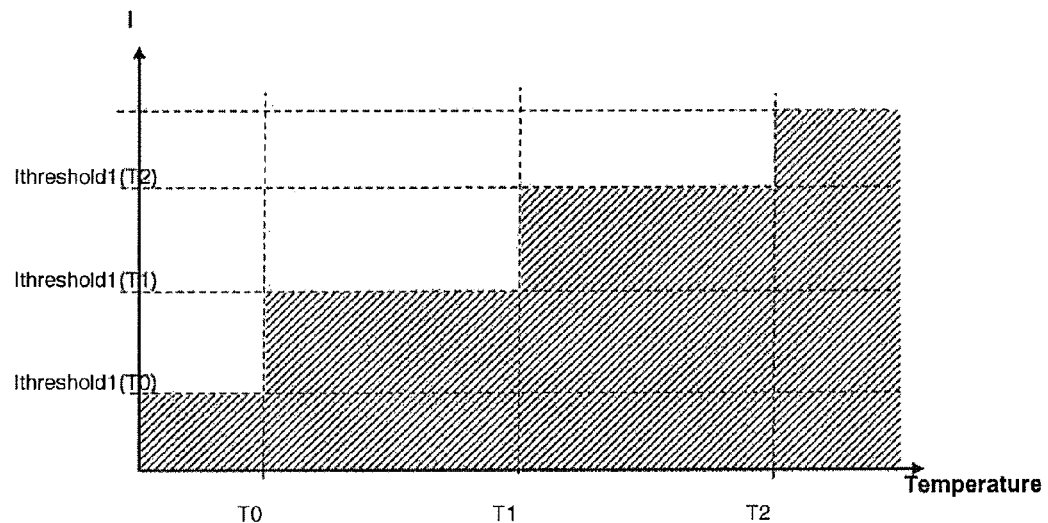
FIG. 6 is a block diagram showing variation of threshold current Ithreshold (or Ithreshold') defining an "under quiescent current conditions" cell condition depending on temperature.

Ithreshold and Ithreshold' may be the same. The value of Ithreshold (or Ithreshold') can be adjusted according to the temperature of a cell. Indeed, internal resistance of a cell decreases with increasing temperature. Therefore, the threshold current value Ithreshold (or Ithreshold') may increase when the temperature rises, which increases the area for quiescent current cell conditions taken in its broadest sense. FIG. 6 shows this variation of current threshold defining "under quiescent current conditions" cell condition as a function of temperature. The hatched area corresponds to the usable threshold current range Ithreshold (or Ithreshold'). The hatched area expands as cell temperature increases.

Figure 7:
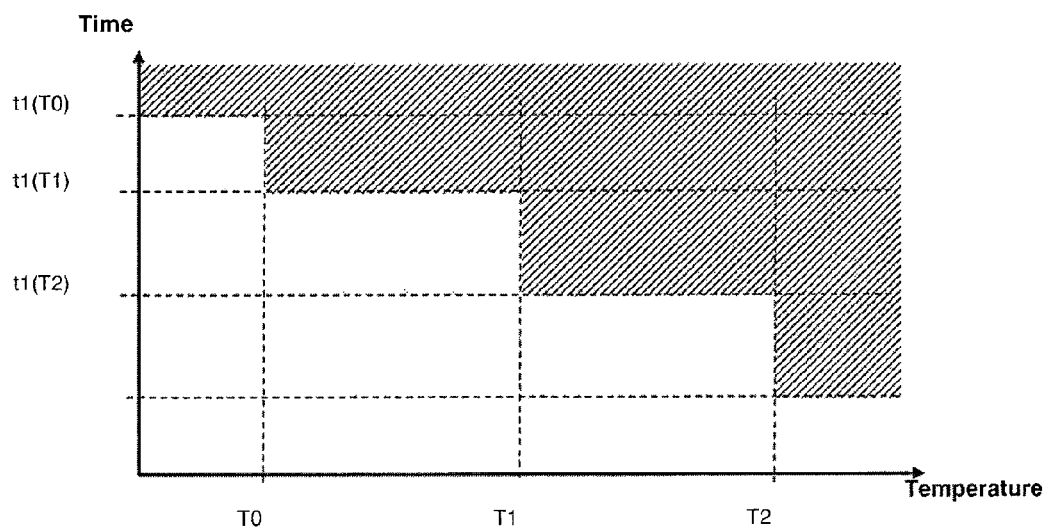
FIG. 7 is a block diagram showing variation in minimum duration prior to authorisation to proceed with adjusting the value of state of charge by the principle of calibration dependant upon cell temperature.

Adjustment of state of charge by calibration of voltage is only performed if a certain amount of time required for stabilization of voltage has passed. The time required for stabilization of voltage is specific to each voltage region. The time required for the stabilization of voltage when the cell is "under quiescent current conditions" is designated by t_Zone4 when voltage is in Zone 4 and t_Zone1 when voltage is in Zone 1. In Zone 4, this waiting time t_Zone4 typically varies between 1 and 30 s. For Zone 1, the waiting time t_Zone1 typically varies between 10 and 600 s. FIG. 7 shows variation with temperature of the minimum duration before proceeding with adjustment of the value of state of charge. The hatched area represents a sufficient range of waiting time before proceeding with adjustment. The time that is sufficient decreases as the temperature increases.

We can split the operating temperature range of the cell into several areas for which we define a minimum duration before making adjustment to the value of state of charge.

Adjustment of state of charge by calibration is accompanied by resetting of a parameter corresponding to the cumulative error in the determination of state of charge by coulometry.

The steps of adjusting state of charge by calibration when the cell is under quiescent current conditions are shown schematically in FIG. 4.

It should be noted that when a current is passing through the cell which is less than Ithreshold or Ithreshold', we can make a correction to the value of VminZone4 and VmaxZone1 to take into account internal resistance of the cell by replacing, firstly:
VminZone4 by the value VminZone4souscourant=VminZone4+r×Ithreshold; and secondly:
VmaxZone1 by the value VmaxZone1souscourant=VmaxZone1+r×Ithreshold';
where:
r is internal resistance of the cell;
Ithreshold and Ithreshold' are defined as previously and are positive for charging and negative for discharge.

Internal resistance of the cell varies as a function of temperature and is readily accessible to the skilled person. It can indeed be measured by causing discharge of the cell at a current I and measuring voltage drop ΔU across its terminals. Internal resistance is obtained by applying the relation r=ΔU/I. Internal resistance is almost constant for a state of charge higher than 90% (Zone 4). For states of charge lower than 30% (Zone 1), we determine an average value of internal resistance in the area of state of charge under consideration.

We can summarize the different situations and adjustment of the charge $SOCV(t_n)$ at time $t_n$ from the calibration relationship of voltage versus state of charge:
- if the voltage V of the cell E at time $t_n$ is greater than VminZone4 and the cell is under quiescent current conditions during a waiting time that exceeds t_Zone4, we proceed with adjustment of the state of charge using data from calibration of the cell. A value of zero is assigned to a parameter corresponding to the cumulative error for state of charge obtained by coulometry Erreurcumulée-SOCC($t_n$).
- if the voltage V of the cell E at time $t_n$ is less than VmaxZone1 and the cell is under quiescent current conditions during a waiting time exceeding t_Zone1, we proceed to adjustment of the state of charge using data from calibration of the cell. A value of zero is assigned to a parameter corresponding to the cumulative error for state of charge obtained by coulometry Erreurcumulée-SOCC($t_n$).

Ib) where the requirements of above section Ia) are not fulfilled, that is to say if:
- the cell is under quiescent current conditions, that is to say that the current is less in absolute value than Ithreshold (or Ithreshold'), but for a period of time that is insufficient, i.e. less than t_Zone4 (or t_Zone1), or
- a current which is greater than the absolute value of Ithreshold (or Ithreshold') is passing through it, then a calculation of state of charge of the cell by coulometry taking into account uncertainty in measurement of current according to the principle explained below is performed:

A current sensor is used to measure the current I flowing through the cell. The initial state of charge $SOC(t_0)$ of cell E is known. It may for example be set by a user beforehand by charging the cell until it reaches a predetermined voltage corresponding to a predetermined state of charge. One can for example charge the cell until its voltage reaches 4V, which voltage value corresponds to a state of 100% charge. Knowing the initial state of charge of the cell $SOC(t_0)$ and applying the technique of coulometry, we can know, at time $t_n$, the state of charge of the cell. The amount of current Q passing through the cell during a time interval Δt (in h) is Q=I×Δt (expressed in Ah). State of charge at time $t_n$ is calculated by integrating the value of the current that has passed through the cell between the initial time $t_0$ and time $t_n$, and relating the amount of electricity obtained by integration to the nominal capacity of the cell i.e.:

$$SOC(t_n) = SOC(t_0) + 100 \times (\int_0^n I \times dt)/(3600 \times C) \tag{I}$$

where:
C is the capacity of the cell E expressed in ampere-hours. Preferably, the value of C is corrected taking account of the state of health or aging (SOH) of the cell and variation of capacity according to temperature from data obtained during laboratory tests. The degree of aging SOH can be determined by an algorithm known in the art for estimating state of health.

I is the current that has passed through the cell (in A) between times $t_0$ and $t_n$ with I>0 in charge and I<0 in discharge;

$SOC(t_0)$ is state of charge of the cell at the initial time $t_0$ expressed in %;

$SOC(t_n)$ is state of charge of the cell at time $t_n$ in %.

The variation of state of charge during a time interval Δt can also be written:

$$\Delta SOC = 100 \times \frac{I \times \Delta t}{3600 \times C} \text{(expressed in \%)} \tag{II}$$

where Δt represents elapsed time between two updates of state of charge expressed in seconds.

Below, we shall use the term $SOCC(t_n)$ to represent state of charge determined by coulometry using the relationship (I) as opposed to $SOCV(t_n)$ which is state of charge determined by calibration of the state of charge as a function of voltage.

Calculated state of charge is corrected to take account of error in the current sensor and for determining a corrected state of charge. Error in state of charge due to the current sensor is estimated. The error in state of charge is always taken as positive and defined as:

$$\Delta ErreurSOC = 100 \times \frac{\left[ErreurIOffsetSOC + \frac{(ErreurIGain \times \text{Abs}(I))}{100}\right] \times \Delta t}{3600 \times C} \tag{III}$$

(expressed in %)

where:
ErreurIOffsetSOC: offset error in current sensor expressed in amperes. The offset error is a constant which can be positive or zero.

ErreurIGain: gain error of the current sensor as a percentage of the measured value, for example between 2 and 5% of the measured value.

Abs (I): absolute value of the current through the cell expressed in amperes.

Δt: time between two updates of state of charge, expressed in seconds.

Gain error of the sensor and sensor offset error data are provided by the manufacturer. Typically, the gain error of the sensor is between 0.1% and 5% and the offset of the sensor is between 0.1% Imax and 5% Imax, Imax being the maximum current measured by the sensor. The gain error of current for a specific measurement can be about 0.5%. This error accumulates over time whenever the current sensor is measuring. The error of the current sensor is added at each step in the calculation of state of charge. Thus, if the current sensor error is 0.5% for an update on state of charge, then after 200 state of charge updates, the error will be 10%, which is significant.

State of charge value SOCC($t_n$) of the cell E at time $t_n$ is corrected by taking into account uncertainty in the measurement of current due to the current sensor. Let t1 be the time at which the first determination is carried out to determine state of charge of the cell by coulometry with error correction. The value of state of charge SOC($t_1$) of the cell at the time t1 lies between the values SOCmax ($t_1$) and SOCmin ($t_1$) where:

$$SOCCmax(t_1)=SOCC(t_1)+\Delta ErreurSOC(t_1) \quad (IV)$$

$$SOCCmin(t_1)=SOCC(t_1)-\Delta ErreurSOC(t_1) \quad (V)$$

At time $t_{n+1}$, SOCCmax($t_{n+1}$) is assigned the value SOCCmax($t_n$)+$\Delta$ErreurSOC($t_{n+1}$) and SOCCmin($t_{n+1}$) is assigned the value SOCCmax($t_n$)−$\Delta$ErreurSOC($t_{n+1}$). SOCCmax($t_{n+1}$) and SOCCmin($t_{n+1}$) are thus revalued as long as the conditions required for determining state of charge by calibration as a function of voltage are not satisfied.

If state of charge of the cell approaches 0% or 100%, the adjustment principle is as explained in paragraph III.

At time $t_{n+1}$ the cumulative error in state of charge resulting from measurement uncertainty in the current sensor since adjustment of state of charge at the preceding time $t_n$ of voltage measurement is calculated according the following principle:

$$ErreurcumuléeSOC(t_{n+1})=ErreurcumuléeSOC(t_n)+\Delta ErreurSOC(t_{n+1})(\text{expressed in \%}) \quad (VI)$$

Where:

ErreurcumuléeSOC($t_{n+1}$) is the updated cumulative error on state of charge at time $t_{n+1}$ resulting from measurement uncertainty of the current sensor.

ErreurcumuléeSOC($t_n$) represents the value thereof at the previous measurement time.

According to one embodiment, if the cumulative error on state of charge of the cell exceeds a preselected limit then the system sends an alert to the user either in the form of a discrete signal or through a message on a communication bus (CAN, Ethernet, SPI, . . . ). Otherwise, no alert is issued to the user.

The steps for calculating state of charge by coulometry taking into account current sensor error are illustrated in set A of the flowchart in FIG. 5.

Where several electrochemical cells are grouped into one module, one can determine the minimum state of charge and maximum state of charge of the module. To do this, one determines the value of state of charge of each cell, and then the minimum value and maximum value of state of charge from the plurality of state of charge values obtained. The minimum value and maximum value indicate the minimum state of charge and the maximum state of charge of the module. Where several modules are combined to form a battery, one can obtain the minimum state of charge of the battery which is equal to the minimum value of the plurality of minimum values of state of charge of the modules and the maximum state of charge of the battery which is equal to the maximum value of the plurality of maximum values of state of charge of the modules.

Figure 2:
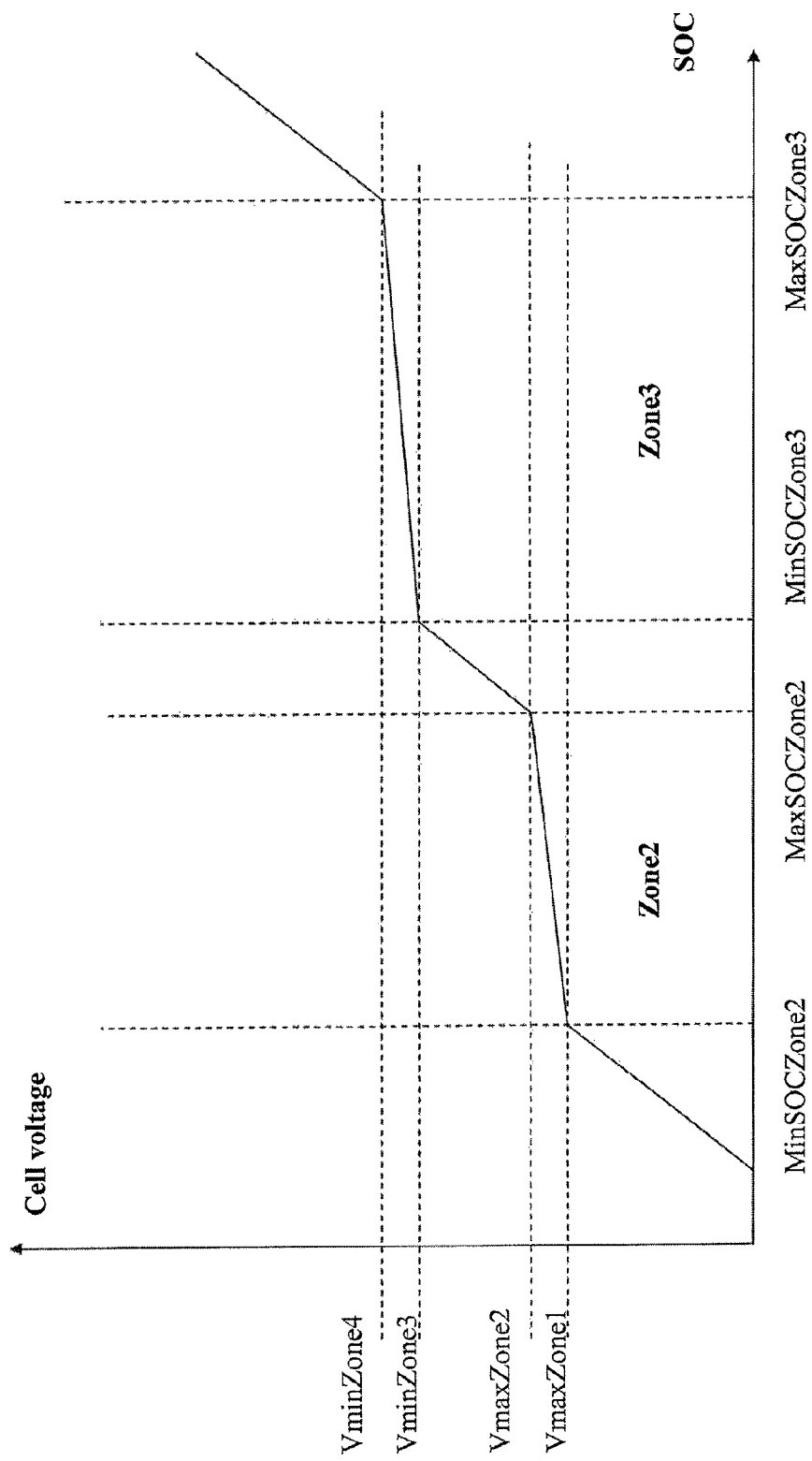
FIG. 2 is an enlarged schematic of FIG. 1 in Zone 23.

II) Adjustment of State of Charge of the Cell when Voltage is in Zone 23:

The method makes it possible, in addition to managing state of charge of the cell in Zone 4, to manage its state of charge in Zone 23. Zone 23 is characterized by a flat charge profile. For this reason, a direct relationship between measured voltage and state of charge cannot be used, unlike the case where voltage is in Zone 1 or Zone 4. In Zone 23, we exploit the value of voltage to define bounds for the value of state of charge as explained below:

II-a) if the cell is "under quiescent current conditions", that is to say, passing a current less than min(Ithreshold, Ithreshold') for a period of time greater than a predetermined value t_Zone23 (FIG. 4), partial readjustment of state of charge is performed, that is to say, it is considered that state of charge should be within a given range of values. For Zone 23, the duration t_Zone23 typically varies between 120 and 1800 s when the cell is "under quiescent current conditions". This partial adjustment of state of charge is followed by a correction of the cumulative error counter value under the conditions as described below. The principle of partial adjustment will now be explained with reference to FIG. 2.

If the measurement of the cell voltage is greater than VmaxZone1 and less than VminZone4, then the value of state of charge SOC is in Zone 23. The value of state of charge should be between the value MinSOCZone2 and the value MaxSOCZone3. Five situations are possible:

Situation 1: If SOCC($t_n$)<MinSOCZone2, then partial adjustment of state of charge is performed by assigning the value MinSOCZone2 thereto. In other words, state of charge obtained by coulometry SOCC($t_n$) is assigned the value MinSOCZone2. The difference (MinSOCZone2−SOCC($t_n$)) is subtracted from the cumulative error in state of charge, in other words:

$$ErreurcumuléeSOC(t_n)=ErreurcumuléeSOC(t_{n-1})-(MinSOCZone2-SOCC(t_n)).$$

Situation 2: If SOCC($t_n$)>MaxSOCZone3, then state of charge is partially adjusted by assigning the value MaxSOCZone3 thereto. In other words, the value of MaxSOCZone3 is assigned to the state charge SOCC($t_n$) obtained by coulometry. The result of the difference (SOCC($t_n$)−MaxSOCZone3) is subtracted from the cumulative error in state of charge or in other words:

$$ErreurcumuléeSOC(t_n)=ErreurcumuléeSOC(t_{n-1})-(SOCC(t_n)-MaxSOCZone3).$$

Situation 3: if V($t_n$)<VmaxZone2 and if SOCC($t_n$)>MaxSOCZone2 then the value MaxSOCZone2 is assigned to SOC ($t_n$) and the value (SOCC($t_n$)−MaxSOCZone2) is subtracted from the cumulative error in state of charge determined by coulometry;

Situation 4: if V($t_n$)>VminZone3 and if SOCC($t_n$)<MinSOCZone3 then the value MinSOCZone3 is assigned to SOC ($t_n$), and the value (MinSOCZone3−SOCC($t_n$)) is subtracted from the cumulative error in determined state of charge obtained by coulometry;

Situation 5: state of charge value SOCC($t_n$) is consistent with the value of voltage V($t_n$). No partial adjustment is made. The value SOCC($t_n$) is assigned to SOC($t_n$). Cumulative measurement error ErreurcumuléeSOCC($t_n$) in state of charge SOCC($t_n$) of the cell E at time $t_n$ is determined.

The following examples illustrate the five situations described above.

Situation 1:

Suppose first that the operator has chosen the following values in advance:

values of 3.30 V and 3.40 V for the voltage thresholds VmaxZone1 and VminZone4 respectively;

values of 30% and 90% for the threshold values of state of charge MinSOCZone2 and MaxSOCZone3 associated with voltage thresholds VmaxZone1 and VminZone4;

Suppose further that current and voltage measurements have given the following results:

a state of charge SOCC($t_n$) of 15%;

a voltage of 3.32 V.

As the cell voltage of 3.32 V lies between 3.30 V (VmaxZone1) and 3.40 V (VminZone4), we deduce that the value of state of charge should actually be between the values of state of charge corresponding thereto, in other words between 30 and 90%. The value of 30% is assigned to the partially adjusted state of charge SOC($t_n$). The difference between MinSOCZone2 and state of charge SOCC($t_n$) is 15%. We consequently subtract 15% from the associated counter for cumulative uncertainty on the value of state of charge.

Situation 2:

Suppose first that the operator has previously selected thresholds for state of charge MinSOCZone2, MaxSOCZone3 and voltage thresholds VmaxZone1 and VminZone4 that are the same as those of the Example illustrating situation 1;

Suppose further that measurements of current and voltage have given the following results:

a state of charge taking account of the measurement error of the sensor SOCC($t_n$) of 95%;

a voltage of 3.34 V.

Since the voltage of the cell, 3.34 V, is between 3.30 V (VmaxZone1) and 3.40 V (VminZone4), it follows that the value of state of charge must in fact be comprised between the corresponding values for state of charge, that is to say 30 and 90%. The value of 90% is assigned to the adjusted state of charge SOC($t_n$). The difference between state of charge SOCC($t_n$) and MaxSOCZone3 is 5%. Consequently, 5% is subtracted from the associated counter for cumulative uncertainty on the minimum value of state of charge.

Situation 3:

State of charge thresholds MinSOCZone2 and MaxSOCZone3 and voltage thresholds VmaxZone1 and VminZone4 are the same as in situation 1. The thresholds MaxSOCZone2 and MinSOCZone3 for state of charge have been chosen to be 60 and 65% respectively. Voltage threshold levels VmaxZone2 and VminZone3 have been chosen to be 3.33 and 3.36 V, respectively.

Suppose that measurement of current and voltage has given the following results:

a state of charge SOCC($t_n$) taking account of measurement error in the sensor of 70%;

a voltage of 3.315 V.

As the voltage of the cell, 3.315 V, is less than 3.33 V (VmaxZone2), it follows that the value of state of charge must in fact be less than or equal to MaxSOCZone2 (60%). The value of 60% is assigned to the partially adjusted state of charge SOC($t_n$). The difference between state of charge SOCC($t_n$) and MaxSOCZone2 is 10%. Consequently, 10% is subtracted from the associated counter for cumulative uncertainty on the minimum value of state of charge.

Situation 4:

The values for threshold voltage and state of charge are the same as those in situation 3.

Suppose that measurements of current and voltage have given the following results:

A state of charge taking account the measurement error of the sensor SOCC($t_n$) of 50%;

A voltage of 3.38 V.

As voltage of the cell, 3.38 V, is greater than 3.36 V (VminZone3), it follows that the value of state of charge must in fact be greater than or equal to MinSOCZone3 (65%). The value of 65% is assigned to the partially adjusted state of charge SOC($t_n$) The difference between MinSOCZone3 and state of charge determined by coulometry SOCC($t_n$) being 15%, then 15% is subtracted from the associated counter for cumulative uncertainty in the value of minimum state of charge.

Situation 5:

The values for threshold voltage and state of charge are the same as those in situations 3 and 4.

Assume that state of charge measured by coulometry SOCC($t_n$) is 45% and the measured voltage is 3.315 V. There is consistency between the value of state of charge obtained by coulometry and the measured voltage. We do not proceed to adjustment of state of charge. The value of 45% is assigned to state of charge SOC($t_n$).

II-b) if the current flowing through the cell is greater in absolute value than the threshold value of current corresponding to a predetermined state under quiescent current conditions, or duration t_Zone23 has not been completed, the cell being under quiescent current conditions, then the method determines state of charge of the cell by taking into account coulometric measurement uncertainty of the current sensor (FIG. 5, Set A) as described above in paragraph Ib). Estimating the error due to the current sensor and calculating a state of charge taking account of said measurement error makes it possible to obtain greater accuracy of state of charge value than the value that would be obtained by conventional coulometry. Indeed, when the cell is used continuously in Zone 23, conventional coulometry would only vary state of charge according to current. Consequently, in the course of progressive use of the cell, uncertainty in state of charge will continue increasing. Estimating the error due to the current sensor provides an indication of cumulative uncertainty in state of charge.

The method according to the invention makes it possible to manage adjustment of a number of cells independently of each other. When a battery consisting of several cells is under quiescent current conditions and the requirements for adjustment based on voltage are met, we may have cells whose voltage is adjusted in Zone 4 while others have a voltage adjusted in Zone 1 while others have voltage adjusted in Zone 23. Regarding periods of time t_Zone1, t_Zone23 and t_Zone4 described above, when the battery is under quiescent current conditions, adjustment of cells with voltage in Zone 4 will take place first, then the cells in Zone 1 are adjusted, and finally if the battery has been long enough under quiescent current conditions, we can adjust the cells situated in Zone 23.

In one embodiment, the value of state of charge adjusted by calibration SOCV($t_n$) is corrected using variation of the capacity of the cell as a function of temperature in order to take into account the decrease of the energy available to the user when the temperature decreases, particularly for temperatures below freezing. Conversely, electrochemical capacity increases with an operating temperature of the cell greater than its rated temperature.

In one embodiment, state of charge thresholds MinSOCZone2, MaxSOCZone2, MinSOCZone3, MaxSOCZone3 are corrected from variation in the capacity of the cell according to the temperature in order to take into account the reduction of the energy available for the user when the temperature decreases, particularly for temperatures below freezing.

In one embodiment, the threshold for state of charge MinSOCZone2, MaxSOCZone2, MinSOCZone3 and MaxSOCZone3 can also be corrected along with voltage thresholds VminZone4, VminZone3, VmaxZone2 and VmaxZone1 as a function of aging condition of the cell from data obtained in the laboratory.

The method selects at any given time that principle of estimating state of charge which is the most effective for the use being made of the cell. Adjustment of state of charge is carried out at time intervals selected by the user, these time intervals not necessarily being periodic. The steps described above are repeated over time. In the situation where adjustment was made by calibration at time $t_n$, the method resets, at the beginning of the next adjustment step at time $t_{n+1}$, initial state of charge $SOC(t_0)$ by assigning it the value $SOCV(t_n)$. $t_0$, the initial time, becomes $t_n$ and state of charge is incremented according to the relation $SOCC(t_n)=\Delta SOCC(t_n-t_{n-1})+SOC(t_{n+1})$ where $\Delta SOCC(t_n-t_{n-1})$ is variation of state of charge of the cell determined by coulometry between times $t_n$ and $t_{n-1}$.

In situations where adjustment is made by coulometry taking into account the error due to current measurement without using a calibration relationship between voltage and state of charge, state of charge is incremented only using the relationship $SOCC(t_n)=\Delta SOCC(t_n-t_{n-1})+SOC(t_{n-1})$.

III) Adjustment of State of Charge when there is Insufficient Time for Stabilizing Voltage:

There may be situations in which the cell is delivering power and it is not possible to adjust its state of charge value by calibration. Such is the case when, for example, the voltage considered in Zone 23 and the cell is undergoing repeated cycles of charge/discharge without a rest period under quiescent current conditions allowing voltage to stabilize as necessary for reliable measurement. This may be for example an application where the cell is used in a hybrid vehicle.

Figure 8:
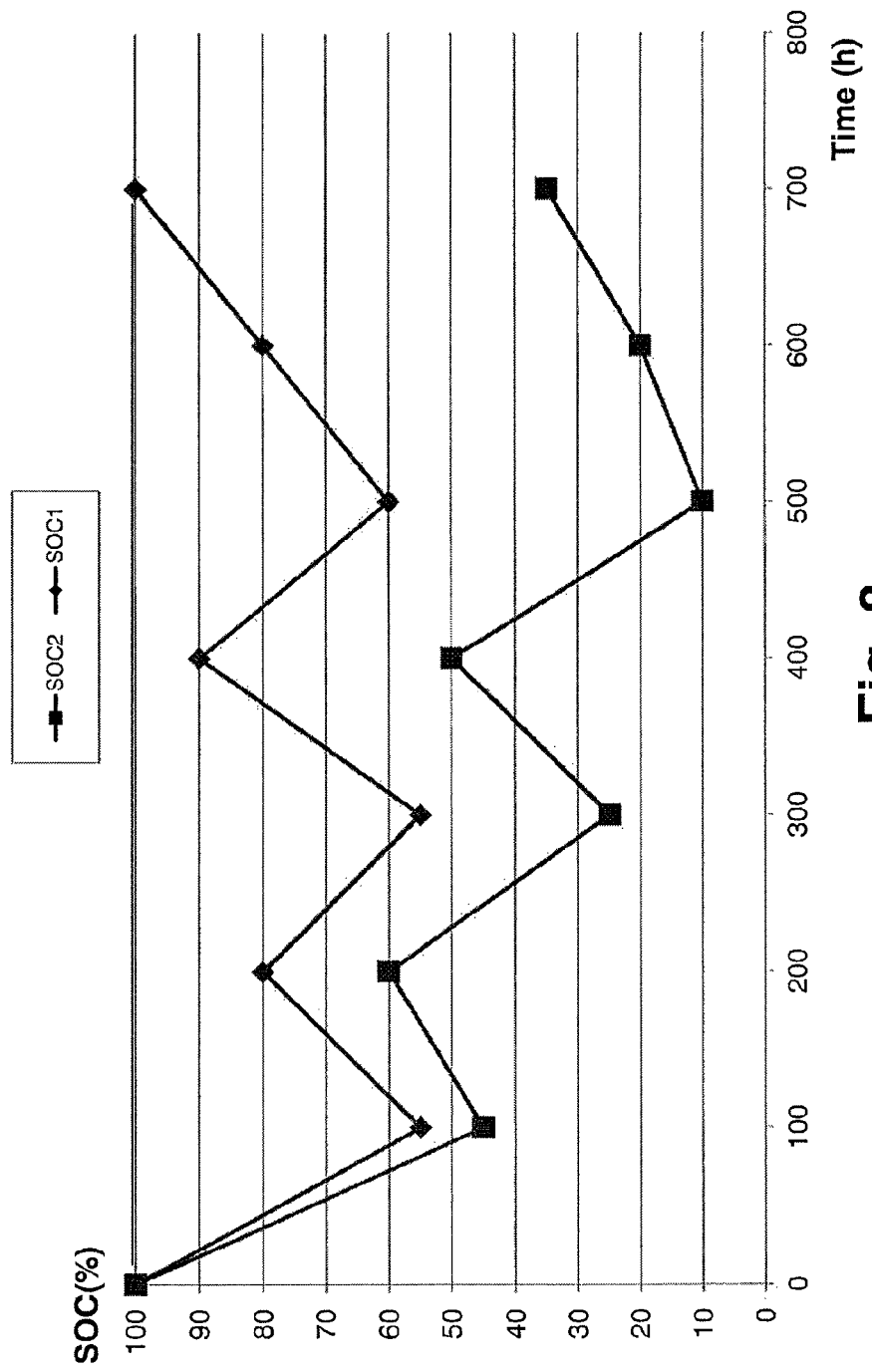
FIG. 8 illustrates a situation in which two electrochemical cells are subjected to repeated cycles of charge/discharge. Adjustment of the value of their state of charge is not possible due to the absence of a period of rest. The value of state of charge SOC1 of a first cell is approaching 100% and the value of state of charge SOC2 of a second cell approaches 0%.

FIG. 8 illustrates a situation in which state of charge SOC1 of a first cell is approaching a value of 100% over time and state of charge SOC2 of a second cell is approaching a value of 0% over time. In this example, the value of state of charge SOC1 and the value of state of charge SOC2 were corrected to take into account the respective errors in measurement of the current sensor according to equations (IV) and (V). As it is not possible to reset the value of cumulative error because the conditions for adjustment by voltage calibration are not met, the values of SOC2 and SOC1 are now drifting towards limit values of 0 and 100%.

In order to prevent state of charge values from reaching the limits of 0 and 100%, we can limit the error due to the current sensor in the calculation of state of charge by coulometry according to the principle described below:

a) if the value of the state of charge measured by coulometry is greater than a predetermined upper state of charge threshold SOCsup, the cell is under charge and its voltage $V(t_n)$ is lower than a threshold voltage Vs1 predetermined in the laboratory, then the value of the predetermined upper threshold is assigned to state of charge $SOC(t_n)$. The upper predetermined state of charge threshold SOCsup can be set at 90% or any value between 90 and 100%. The method therefore includes diminishing state of charge by assigning the value SOCsup thereto. This threshold can be varied according to the temperature of the cell. The predetermined voltage threshold determined in the laboratory Vs1 may be set at 3.65 V for an upper threshold for state of charge of 90%, during a waiting time exceeding a threshold t6, typically of 5 s but able to vary typically in the range from 1 s to 60 s. The threshold voltage can be modified according to the measured value of the current through the cell. This current can be chosen to be less than the rated current for continuous charge recommended by the manufacturer of the cell.

The condition with cell voltage lower than a threshold value Vs1 (for example 3.65 V) makes it possible to verify that the actual state of charge of the cell is indeed much lower than the high state of charge threshold, for example 90%. If this condition is not verified, this means that state of charge is actually higher than 90%. The cell must be on charge, otherwise discharge would result in an ohmic voltage drop and thus a shift of cell voltage to a lower voltage, which would not make it possible to ensure that cell voltage is indeed lower than said predetermined threshold value.

b) if the value of the state of charge measured by coulometry is below a predetermined lower state of charge threshold SOCinf, the cell is under discharge and the voltage $V(t_n)$ is higher than a threshold voltage Vs2 predetermined in the laboratory, then the predetermined low threshold value is assigned to state of charge $SOC(t_n)$.

The predetermined low state of charge threshold SOCinf may be set at 10% or any value between 0 and 10%. The method therefore includes increasing state of charge by assigning the value SOCinf thereto. This threshold can be modified according to the temperature of the cell.

The threshold voltage Vs2 predetermined in the laboratory can be set at 3V for a lower threshold for state of charge of 10% for a period greater than a threshold t7, typically 5 seconds, but able to vary within a range of from 1 s to 60 s. This threshold voltage can be modified according to the measured value of the current through the cell. This current can be chosen to be less than the rated current under continuous discharge recommended by the manufacturer of the cell.

The condition that cell voltage be greater than a threshold value Vs2 (for example 2.9 V) makes it possible to verify that the actual state of charge of the cell is much higher than the low state of charge threshold, for example 10%. If this condition is not verified, it means that state of charge is actually less than 10%. The cell must be in discharge, otherwise charging would bring about an ohmic jump with a consequent shift of cell voltage to a higher voltage, which would not allow it to be ensured that the open circuit voltage of the cell is indeed higher than said predetermined threshold value.

The steps of diminishing and increasing state of charge values to 10 and 90% are depicted in set B of the flowchart in FIG. 5.

Thus, one can maintain SOC1 at 90% and SOC2 at 10% although the voltage of the cell is in Zone 23 and current flow through the cell is uninterrupted. This makes it possible for the application to which the cell is connected to continue operating.

Figure 9A:
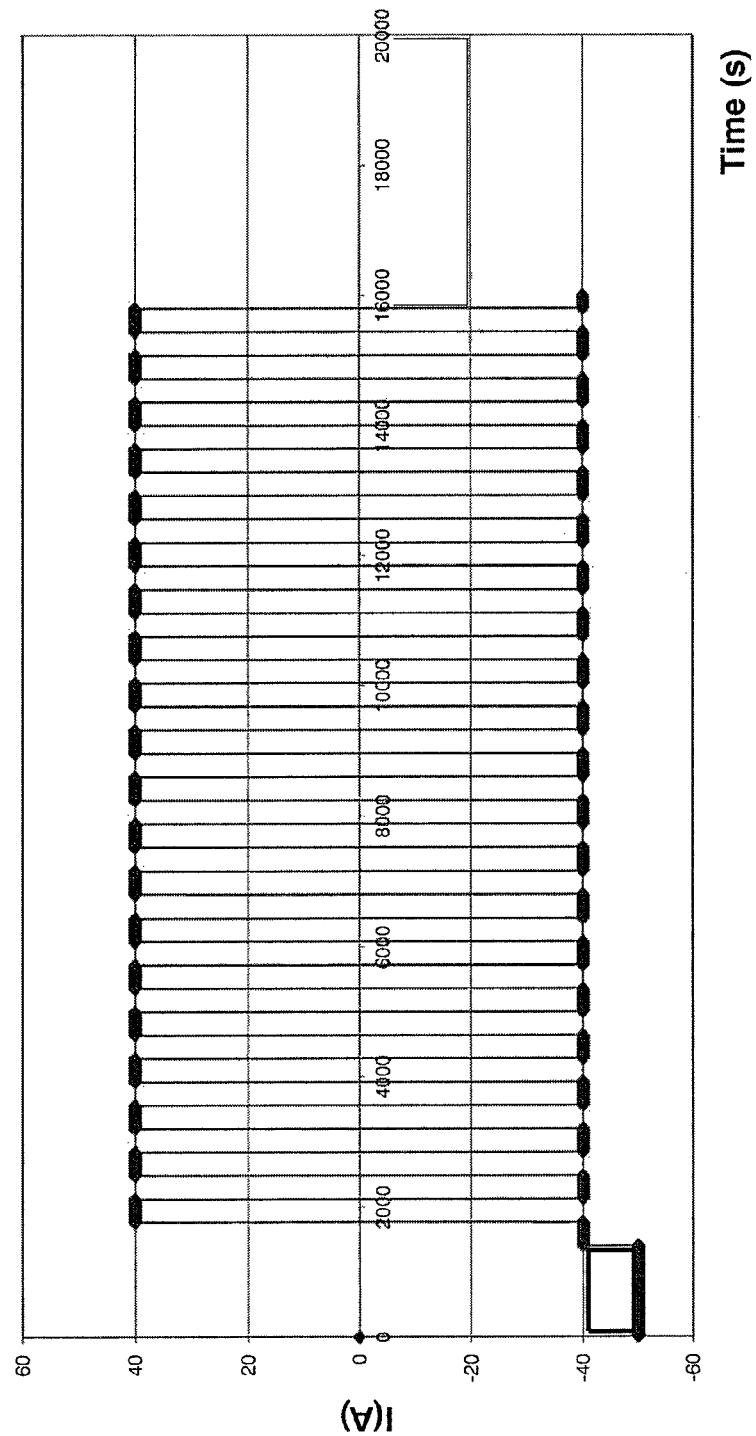
FIGS. 9a, b, c and d represent the results obtained by simulation with a conventional current sensor: cumulative error of gain of 10% and offset 2 A.
Figure 9B:
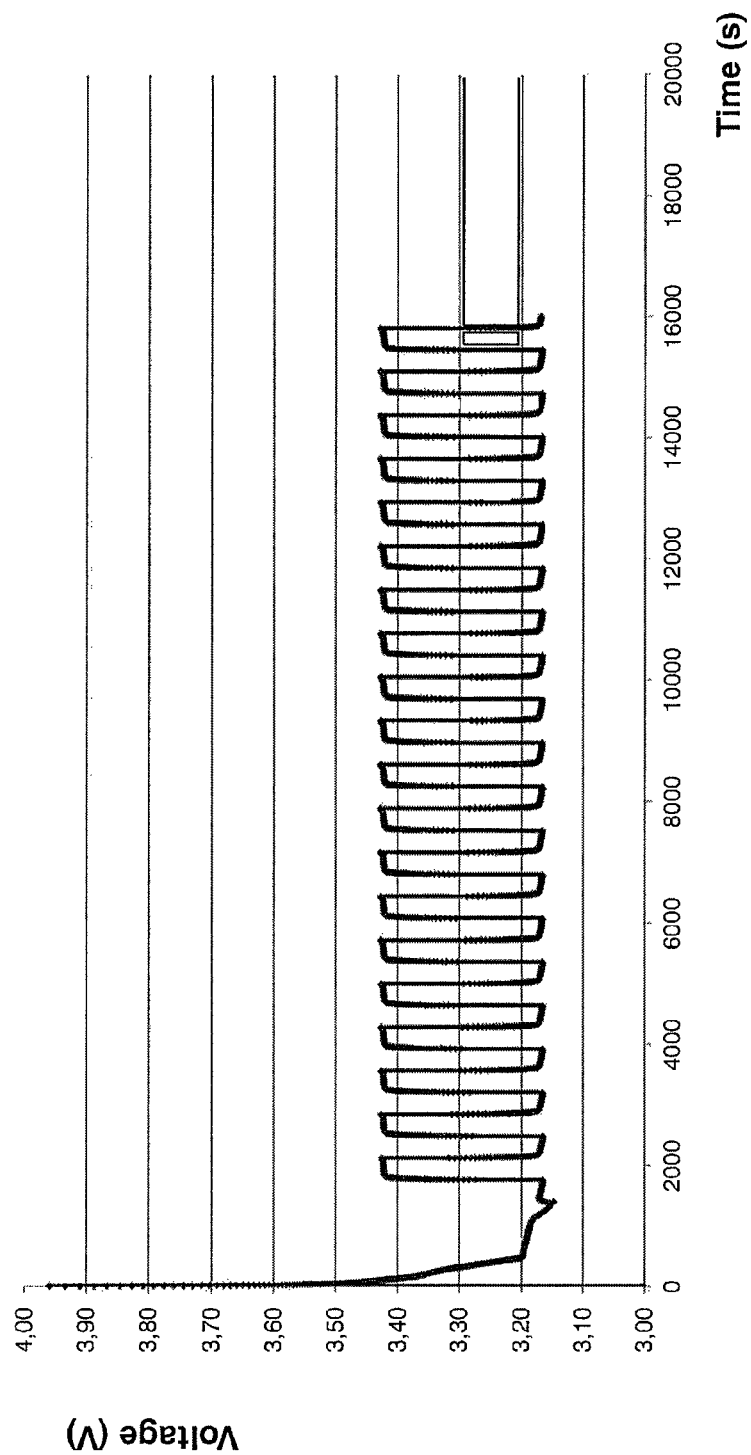
FIG. 9b shows variation of voltage across the cell subjected to repeated cycles.
Figure 9C:
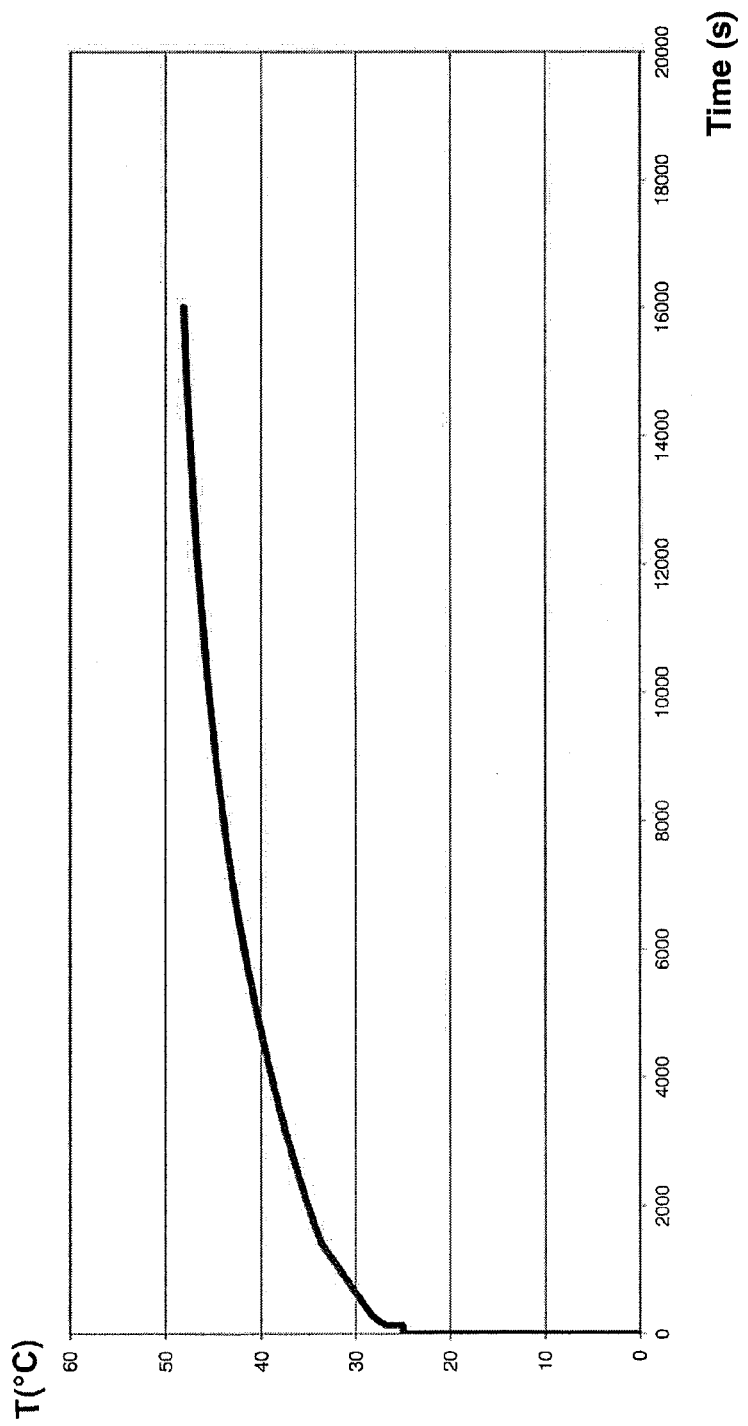
FIG. 9c shows the increase in temperature of the cell subjected to repeated cycles.
Figure 9D:
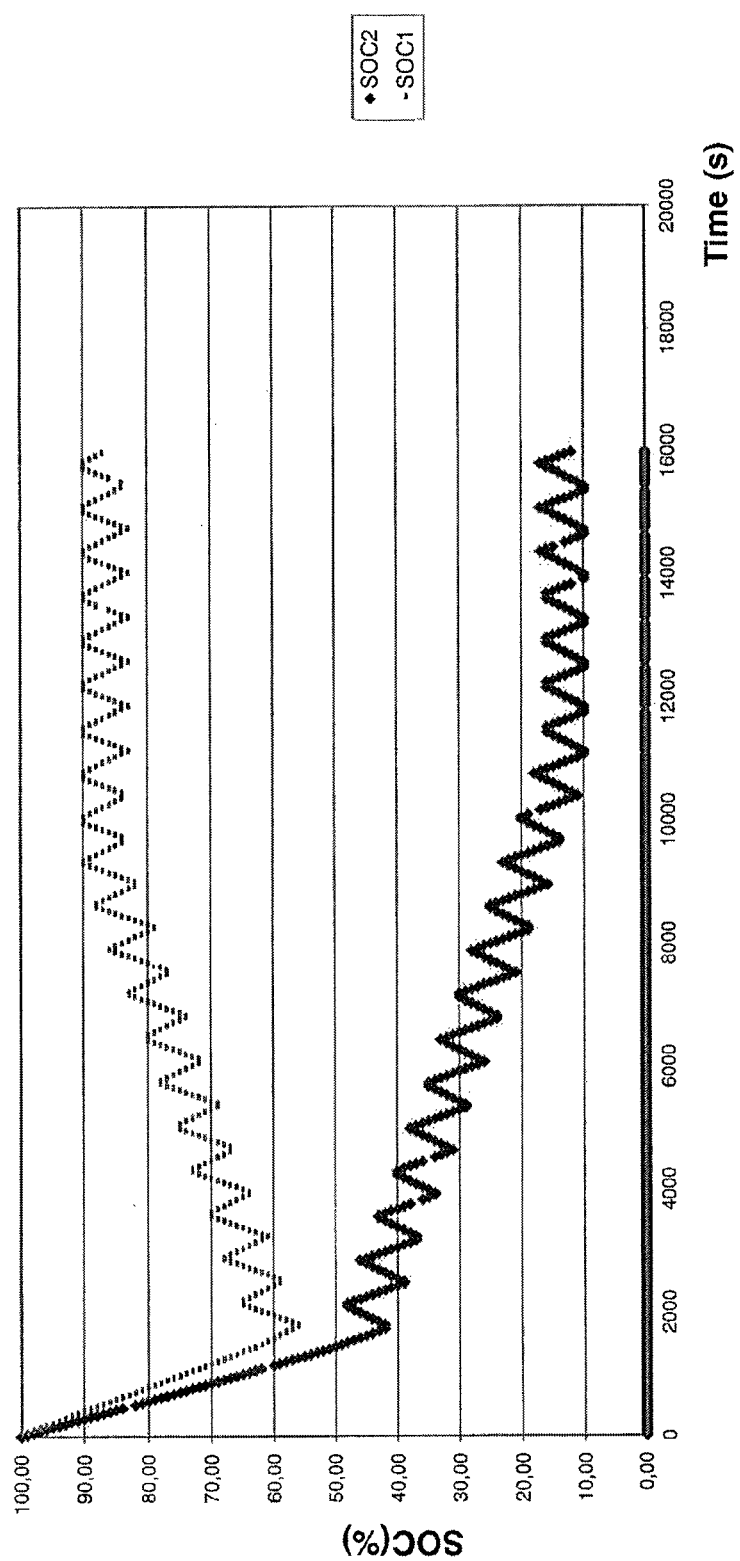
FIG. 9d shows the limitation of SOC1 to 90% and of SOC2 to 10%.

FIGS. 9a-d show the results obtained by simulation with a current sensor that is performing badly: cumulative error of 10% in gain and offset of 2 A. FIG. 9a shows variation of the current through the cell when the latter is subjected to a repetition of cycles each consisting of a discharge at a current of 40 A followed by charging at a current of 40 A. FIG. 9b shows a curve of variation of cell voltage during cycling. FIG. 9c shows temperature increase due to the heating of the cell during discharge. In a situation of cycling, there is an accumulation of error in current measurement at each measurement of capacity and, as state of charge is never adjusted, the associated cumulative uncertainty counter Erreurcumulée-SOC is never reset. To limit an increase in the difference between state of charge of a first cell and the state of charge of a second cell, their state of charge is limited to the respective values of 10 and 90%. FIG. 9d shows variation of state of charge of the two cells during cycling. This diagram shows initially a decrease in state of charge corresponding to a discharge current of −50 A, followed by a succession of peaks. Each peak corresponds to a variation of state of charge during a cycle of charging/discharging. The rising part of the peak corresponds to the charge current of 40 A and the descending part is the discharge current at 40 A. When state of charge of the first cell exceeds the value of 90%, it is assigned the value of 90% as the maximum voltage is indeed below a threshold of 3.6 V during charging. Similarly, when state of charge of the second cell falls below the value of 10%, it is assigned the value of 10% as the minimum voltage is greater than 2.9 V during discharge.

Figure 1:
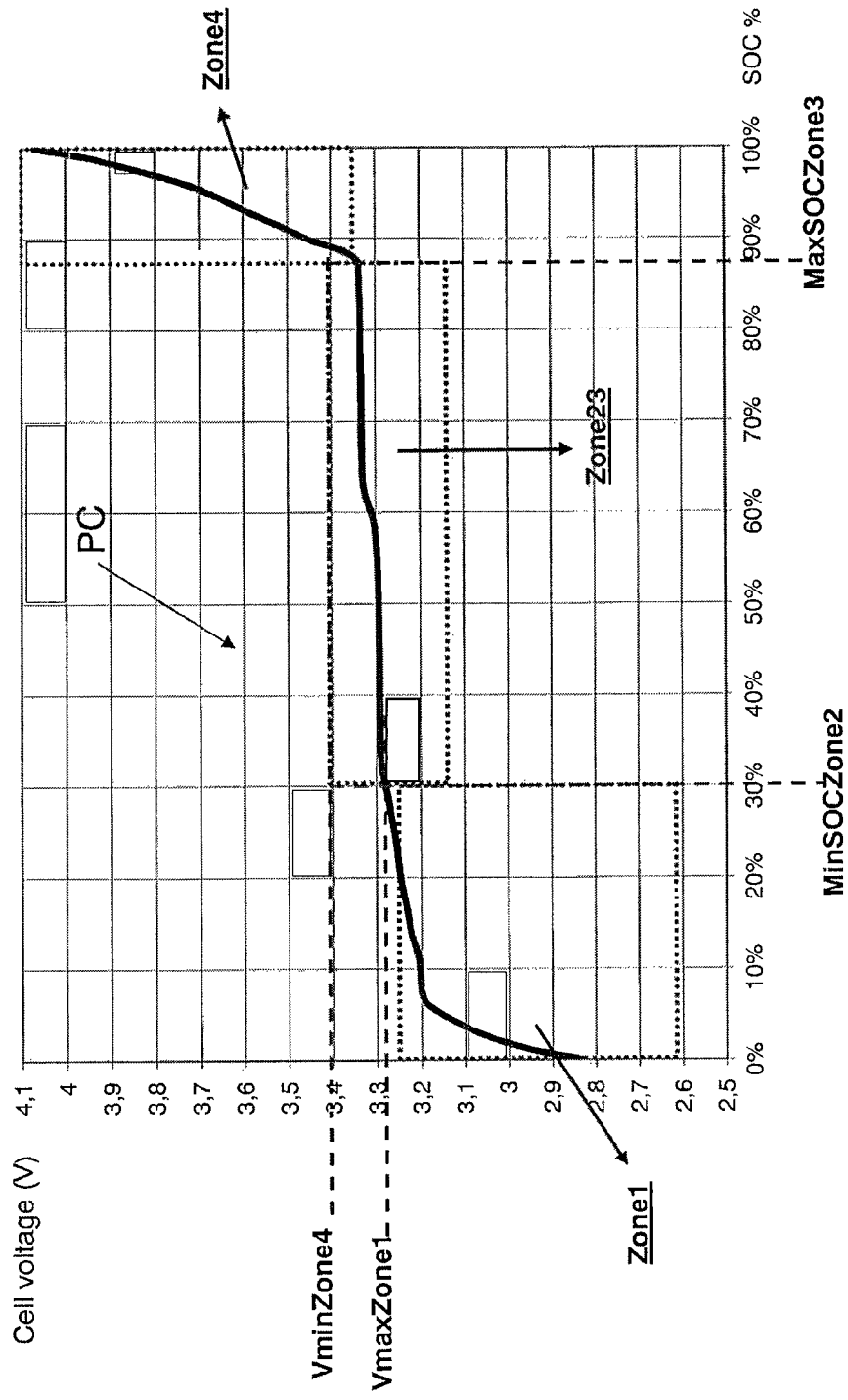
FIG. 1 shows variation at 30° C. of open circuit voltage as a function of state of charge of a cell whose positive electrode comprises an electrochemically active material of the type described in EP-A-2,269,954.

For safety reasons, it is preferred to give the user an indication of state of charge of a cell that is underestimated compared to the actual state of charge to ensure availability of energy to the user. On the other hand, when a cell is being discharged and its state of charge is approaching 10%, its voltage decreases rapidly. FIG. 1 indeed shows that cell voltage varies by more than 300 mV for a state of charge comprised between 0 and 10%. There is consequently a risk of a sudden drop in voltage of the cell when its state of charge falls below 10%. In order to avoid such a sharp drop in voltage and avoid the possibility of the user no longer having the remaining energy in the cell available without having been warned in advance, the method includes the following function: if adjusted minimum state of charge is less than a lower threshold, typically 20%, and the minimum voltage of the cell is below a predetermined threshold value Vminsafe determined in the laboratory, typically 2.7 V, for a period of time greater than a threshold period t8, typically 5 s but the value of which can range between 1 s and 60 s, then a value of 0% is assigned to the minimum state of charge. This threshold voltage Vminsafe can be modified as a function of the measured value of the current through the cell. The function for detecting depletion of available energy is shown by Part C of the flowchart in FIG. 5.

Figure 10:
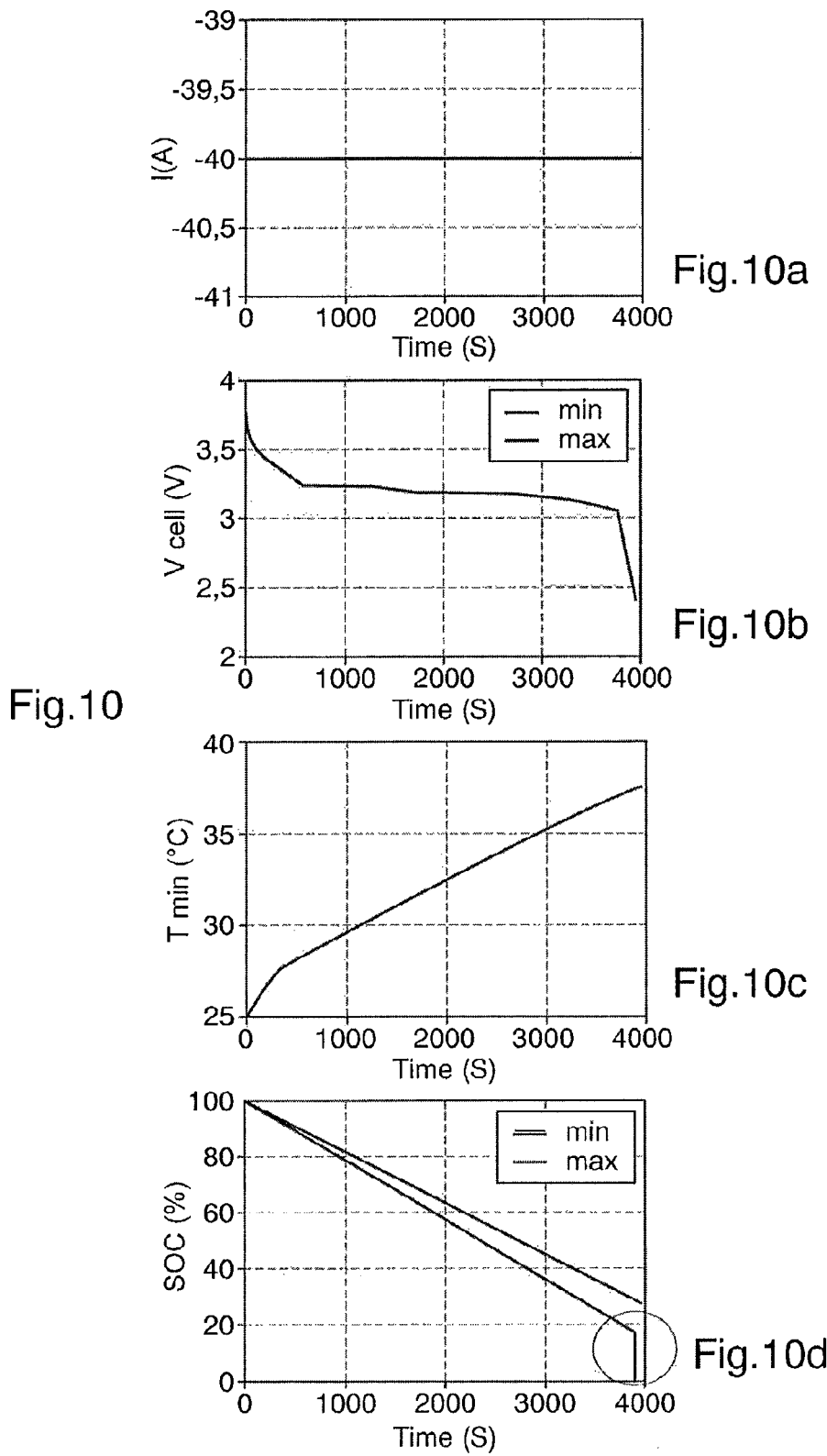
FIG. 10 shows a simulation of the detection of a low safety threshold for state of charge SOCminsafe. A value of 0% is assigned to state of charge when the latter falls below a lower safety threshold (20% in the example) and if the value of the discharge voltage $V(t_n)$ is lower than a predetermined value Vminsafe for a predetermined time t8.

FIGS. 10*a-d* show a simulation of the detection of a lower safety threshold for state of charge, further to which we assign the value of 0% to state of charge. FIG. 10*a* shows a constant current of −40 A indicating that the cell is subjected to a continuous discharge at the same current of −40 A for over an hour. FIG. 10*b* shows the curve of variation of cell voltage during discharge. We can observe:

A first area ranging from 0 to about 600 s during which voltage varies in proportion to state of charge;
A second area of from about 600 to about 3800 s during which voltage varies slightly as a function of state of charge;
A third area from about 3800 s in which there is a sudden drop in voltage.

FIG. 10*c* shows increase in temperature due to heating of the cell during discharge. FIG. 10*d* shows linear variation of state of charge as a function of time.

When state of charge of the cell drops below 20%, and its voltage has dropped below 2.7 V for at least 5 s, it is assigned the value of 0%.

The invention claimed is:

1. A method for estimating state of charge (SOC) of an electrochemical cell (E) having a charge profile (PC) in which variation of voltage as a function of state of charge between a state of charge higher than a value MinSOCZone2 of state of charge corresponding to a predetermined voltage VmaxZone1 and a state of charge less than a value MaxSOCZone3 corresponding to a predetermined voltage VminZone4 is, on average, at least 10 times less rapid than variation in voltage for a state of charge greater than MaxSOCZone3, and wherein the charge profile further comprises an area in which variation of voltage of said cell as a function of state of charge for a state of charge less than value MinSOCZone2 corresponding to voltage VmaxZone1 is on average at least twice as rapid as variation in voltage for a state of charge between values of MinSOCZone2 and MaxSOCZone3, and wherein said charge profile for a state of charge between MinSOCZone2 and MaxSOCZone3 exhibits:
a first sub-area ranging from MinSOCZone2 to a value of state of charge MaxSOCZone2; MaxSOCZone2 being a value corresponding to a predetermined voltage value VmaxZone2;
a second sub-area ranging from a value of state of charge MinSOCZone3 to a value of state of charge MaxSOCZone3; said value of state of charge MinSOCZone3 corresponding to a predetermined voltage value VminZone3;

said method comprising the steps of:
a) providing a cell; connecting said cell to a device for charging or discharging it and measuring a current I through the cell; providing a calibration relationship between state of charge of the cell and voltage;
b) providing an initial state of charge $SOC(t_0)$ of said cell at an initial time $t_0$;
c) measuring cell voltage $V(t_n)$ of said cell (E) and determining an adjusted state of charge $SOC(t_n)$ of said cell at a point in time $t_n$ later than $t_0$ when $V(t_n)$ is greater than or equal to said voltage VminZone4, under the following conditions:
i) if a current $I(t_n)$ lower in absolute value than a predetermined current threshold value Ithreshold has been passing through said cell for longer than a predetermined value t_Zone4, then a value $SOCV(t_n)$ is determined from said calibration relationship of voltage as a function of state of charge, and said value $SOCV(t_n)$ is assigned to $SOC(t_n)$ and a zero value is assigned to a parameter corresponding to a cumulative error in state of charge obtained by coulometry ErreurcumuléeSOCC $(t_n)$;
ii) otherwise a value $SOCC(t_n)$ determined by coulometry is assigned to $SOC(t_n)$ and a cumulative measurement error ErreurcumuléeSOCC$(t_n)$ of the measurement of state of charge $SOCC(t_n)$ of said cell between time $t_0$ and time $t_n$ is determined, and wherein step c) further comprises determining an adjusted state of charge $SOC(t_n)$ of said cell at a point in time $t_n$ greater than $t_0$, when cell voltage $V(t_n)$ is less than or equal to said voltage VmaxZone1, under the following conditions:
i) if a current $I(t_n)$ lower in absolute value than a predetermined current threshold value Ithreshold' has been passing through said cell for longer than a predetermined period of time t_Zone1, then a value $SOCV(t_n)$ is determined from said calibration relationship of voltage as a function of state of charge SOC, said value $SOCV(t_n)$ is assigned to $SOC(t_n)$ and a value of zero is assigned to a parameter corresponding to cumulative error in state of charge obtained by coulometry ErreurcumuléeSOCC $(t_n)$;
ii) otherwise a value $SOCC(t_n)$ determined by coulometry is assigned to $SOC(t_n)$ and a cumulative measurement error ErreurcumuléeSOCC$(t_n)$ in measurement of state of charge $SOCC(t_n)$ of said cell between time $t_0$ and time $t_n$ is determined, and wherein step c) further comprises assigning a value SOC $(t_n)$ to said cell at a point in time $t_n$ greater than $t_0$ when cell voltage $V(t_n)$ of said cell is greater than VmaxZone1 and less than VminZone4, under the following conditions:
i) if the cell is being traversed by a current $I(t_n)$ lower in absolute value than a predetermined threshold current equal to min(Ithreshold, Ithreshold') for a period of time greater than a predetermined value t_Zone23, value assigning is performed under the following conditions:
  if SOCC($t_n$)>MaxSOCZone3 then the value MaxSOCZone3 is assigned to SOC($t_n$) and the value (SOCC($t_n$)−MaxSOCZone3) is subtracted from the cumulative error in state of charge value determined by coulometry;
  if SOCC($t_n$)<MinSOCZone2 then the value MinSOCZone2 is assigned to SOC($t_n$) and the value (MinSOCZone2−SOCC($t_n$)) is subtracted from the cumulative error in state of charge determined by coulometry;
  if V($t_n$)<VmaxZone2 and if SOCC($t_n$)>MaxSOCZone2 then the value MaxSOCZone2 is assigned to SOC($t_n$) and the value (SOCC($t_n$)−MaxSOCZone2) is subtracted from the cumulative error in state of charge determined by coulometry;
  if V($t_n$)>VminZone3 and if SOCC($t_n$)<MinSOCZone3 then MinSOCZone3 is assigned to SOC($t_n$) and the value (MinSOCZone3−SOCC($t_n$)) is subtracted from the cumulative error in state of charge determined by coulometry;
  ii) otherwise a state of charge SOCC($t_n$) determined by coulometry is assigned to SOC($t_n$) and a cumulative measurement error ErreurcumuléeSOCC($t_n$) in measurement of state of charge SOCC($t_n$) of the cell E at time $t_n$ is determined.

2. The method according to claim 1, wherein state of charge of the cell E is estimated at a time $t_{n+1}$ greater than $t_n$ under the following conditions:
  if condition c) i) is satisfied at time $t_n$, then an initial state of charge SOC($t_0$) is reset by assigning the value SOCV($t_n$) thereto and steps b) and c) are performed with $t_0=t_n$ and SOCC($t_{n+1}$)=ΔSOCC($t_{n+1}-t_n$)+SOC($t_n$);
  if condition c) ii) is satisfied, then SOCC($t_{n+1}$)=ΔSOCC($t_{n+1}-t_n$)+SOC($t_n$);
  wherein ΔSOCC($t_{n+1}-t_n$) is the variation of state of charge of said cell E determined by coulometry between times $t_n$ and $t_{n+1}$.

3. The method according to one of the claim 1, wherein error in state of charge obtained by coulometry ΔErreurSOC between times $t_n$ and $t_{n+1}$ is:

$$\Delta ErreurSOC(\%) = 100 \times \frac{\left[ ErreurIOffsetSOC + \frac{(ErreurIGain \times \text{Abs}(I))}{100} \right] \times (t_{n+1} - t_n)}{3600 \times C}$$

with:
ErreurIOffsetSOC: offset error of the current measuring device expressed in amperes;
ErreurIGain: gain error of the current measuring device as a percentage of measured current;
Abs (I): absolute value of the current I flowing through the cell expressed in amperes;
C: capacity of the cell expressed in ampere-hours;
$t_{n+1}-t_n$ is the elapsed time between two updates of state of charge, expressed in seconds.

4. The method according to claim 3, including calculating at time $t_{n+1}$ cumulative error in state of charge since adjustment of state of charge at a previous point in time $t_n$ using the following relationship:

ErreurcumuléeSOC($t_{n+1}$)(%)=ErreurcumuléeSOC($t_n$)+ΔErreurSOC($t_{n+1}$)

where
ErreurcumuléeSOC($t_{n+1}$) is updated cumulative error in state of charge at time $t_{n+1}$ resulting from measurement error in the current sensor;
ErreurcumuléeSOC($t_n$) is the value of cumulative error at the previous measurement time $t_n$, and
ErreurcumuléeSOC($t_0$)=0.

5. The method according to claim 1, comprising after step c) ii) one of the following steps of:
  α) assigning to state of charge SOC($t_n$) a predetermined value SOCsup, preferably between 90% and 100% if, firstly, SOC($t_n$) is greater in value than the value of state of charge SOCsup and if, secondly, cell voltage under charge V($t_n$) is below a predetermined threshold voltage value Vs1 for a predetermined time t6, or
  β) assigning to state of charge SOC($t_n$) a predetermined value SOCinf, preferably less than 10% if, firstly, SOC($t_n$) is less than the value of state of charge SOCinf and if, secondly, cell voltage under discharge V($t_n$) is higher than a predetermined threshold voltage value Vs2 for a predetermined time t7.

6. The method according to claim 1, comprising after step c) ii) the following step of:
  γ) assigning to state of charge SOC($t_n$) a value of 0% if, firstly the value of SOC($t_n$) is less than a safety threshold value of state of charge SOCminsafe, for example 20%, and if, secondly, the value of cell discharge voltage V($t_n$) is lower than a predetermined voltage value Vminsafe for a predetermined time t8.

7. The method according to claim 1, including interrupting charging or discharge of the cell when cumulative error ErreurcumuléeSOCC($t_n$) of said cell E exceeds a predetermined threshold value and/or sending a warning message to a user.

8. The method according to claim 1, including measuring a temperature of the cell E and increasing the values of Ithreshold and Ithreshold' when cell temperature has increased.

9. The method according to claim 1, including measuring a temperature of the cell E and decreasing the values of t_Zone4, t_Zone1 and t_Zone23 when cell temperature has increased.

10. The method according claim 1, wherein the values of VminZone4 and VmaxZone1 are corrected to take account of internal resistance r of the cell E, said correction consisting in adding to VminZone4 and VmaxZone1 a quantity r×I($t_n$), where I($t_n$) is negative when the cell is in discharge and positive when the cell is being charged.

11. A system for estimating state of charge (SOC) of an electrochemical cell (E) having a charge profile (PC) in which variation of voltage as a function of state of charge between a state of charge higher than a value MinSOCZone2 of state of charge corresponding to a predetermined voltage VmaxZone1 and a state of charge less than a value of state of charge MaxSOCZone3 corresponding to a predetermined voltage VminZone4 is, on average, at least 10 times less rapid than variation in voltage for a state of charge greater than MaxSOCZone3,
  wherein the charge profile further comprises an area in which variation of voltage of said cell as a function of state of charge for a state of charge less than a value MinSOCZone2 corresponding to voltage VmaxZone1 is on average at least twice as rapid as variation in voltage for a state of charge between values of MinSOCZone2 and MaxSOCZone3, and
  wherein said charge profile for a state of charge between MinSOCZone2 and MaxSOCZone3 exhibits:

a first sub-area ranging from MinSOCZone2 to a value of state of charge MaxSOCZone2; MaxSOCZone2 being a value corresponding to a predetermined voltage value VmaxZone2;

a second sub-area ranging from a value of state of charge MinSOCZone3 to a value of state of charge MaxSOCZone3; said value of state of charge MinSOCZone3 corresponding to a predetermined voltage value VminZone3;

said system comprising:

a) means for measuring a current I flowing through the cell;
b) means for measuring voltage V of the cell;
c) an electronic data management system for the cell, including a computer configured to:
calculate state of charge of the cell E by coulometry;
perform estimation of state of charge of said cell according to a method comprising the steps of:
a) providing a cell; connecting said cell to a device for charging or discharging it and measuring a current I through the cell; providing a calibration relationship between state of charge of the cell and voltage;
b) providing an initial state of charge $SOC(t_0)$ of said cell at an initial time $t_0$;
c) measuring cell voltage $V(t_n)$ of said cell (E) and determining an adjusted state of charge $SOC(t_n)$ of said cell at a point in time $t_n$ later than $t_0$ when $V(t_n)$ is greater than or equal to said voltage VminZone4, under the following conditions:
i) if a current $I(t_n)$ lower in absolute value than a predetermined current threshold value Ithreshold has been passing through said cell for longer than a predetermined value t_Zone4, then a value $SOCV(t_n)$ is determined from said calibration relationship of voltage as a function of state of charge, and said value $SOCV(t_n)$ is assigned to $SOC(t_n)$ and a zero value is assigned to a parameter corresponding to a cumulative error in state of charge obtained by coulometry ErreurcumuléeSOCC$(t_n)$;
ii) otherwise a value $SOCC(t_n)$ determined by coulometry is assigned to $SOC(t_n)$ and a cumulative measurement error ErreurcumuléeSOCC$(t_n)$ of the measurement of state of charge $SOCC(t_n)$ of said cell between time $t_0$ and time $t_n$ is determined, and
wherein step c) further comprises determining an adjusted state of charge $SOC(t_n)$ of said cell at a point in time $t_n$ greater than $t_0$, when cell voltage $V(t_n)$ is less than or equal to said voltage VmaxZone1, under the following conditions:
i) if a current $I(t_n)$ lower in absolute value than a predetermined current threshold value Ithreshold' has been passing through said cell for longer than a predetermined period of time t_Zone1, then a value $SOCV(t_n)$ is determined from said calibration relationship of voltage as a function of state of charge SOC, said value $SOCV(t_n)$ is assigned to $SOC(t_n)$ and a value of zero is assigned to a parameter corresponding to cumulative error in state of charge obtained by coulometry ErreurcumuléeSOCC$(t_n)$;
ii) otherwise a value $SOCC(t_n)$ determined by coulometry is assigned to $SOC(t_n)$ and a cumulative measurement error ErreurcumuléeSOCC$(t_n)$ in measurement of state of charge $SOCC(t_n)$ of said cell between time $t_0$ and time $t_n$ is determined, and
wherein step c) further comprises assigning a value SOC$(t_n)$ to said cell at a point in time $t_n$ greater than $t_0$ when cell voltage $V(t_n)$ of said cell is greater than VmaxZone1 and less than VminZone4, under the following conditions:
i) if the cell is being traversed by a current $I(t_n)$ lower in absolute value than a predetermined threshold current equal to min(Ithreshold, Ithreshold') for a period of time greater than a predetermined value t_Zone23, value assigning is performed under the following conditions:
if $SOCC(t_n)$>MaxSOCZone3 then the value MaxSOCZone3 is assigned to $SOC(t_n)$ and the value (SOCC$(t_n)$−MaxSOCZone3) is subtracted from the cumulative error in state of charge value determined by coulometry;
If $SOCC(t_n)$<MinSOCZone2 then the value MinSOCZone2 is assigned to $SOC(t_n)$ and the value (MinSOCZone2−SOCC$(t_n)$) is subtracted from the cumulative error in state of charge determined by coulometry;
If $V(t_n)$<VmaxZone2 and if $SOCC(t_n)$>MaxSOCZone2 then the value MaxSOCZone2 is assigned to $SOC(t_n)$ and the value (SOCC$(t_n)$−MaxSOCZone2) is subtracted from the cumulative error in state of charge determined by coulometry;
If $V(t_n)$>VminZone3 and if $SOCC(t_n)$<MinSOCZone3 then MinSOCZone3 is assigned to $SOC(t_n)$ and the value (MinSOCZone3−SOCC$(t_n)$) is subtracted from the cumulative error in state of charge determined by coulometry;
ii) otherwise a state of charge $SOCC(t_n)$ determined by coulometry is assigned to $SOC(t_n)$ and a cumulative measurement error ErreurcumuléeSOCC$(t_n)$ in measurement of state of charge $SOCC(t_n)$ of the cell E at time $t_0$ is determined.

12. The system of claim 11, further comprising means for storing a state of health, SOH, of said cell.

13. An assembly comprising:
the system according to claim 11;
at least one cell (E) having a charge profile (PC) in which variation of voltage as a function of state of charge between a state of charge higher than a value of state of charge MinSOCZone2 corresponding to a predetermined voltage VmaxZone1 and a state of charge less than a value MaxSOCZone3 corresponding to a predetermined voltage VminZone4 is, on average, at least 10 times less rapid than variation in voltage for a state of charge greater than MaxSOCZone3,
wherein the charge profile further comprises an area in which variation of voltage of said cell as a function of state of charge for a state of charge less than a minimum value MinSOCZone2 corresponding to voltage VmaxZone1 is on average at least twice as rapid as variation in voltage for a state of charge between values of MinSOCZone2 and MaxSOCZone3, and
wherein said charge profile for a state of charge between MinSOCZone2 and MaxSOCZone3 exhibits:
a first sub-area ranging from MinSOCZone2 to a value of state of charge MaxSOCZone2; MaxSOCZone2 being a value corresponding to a predetermined voltage value VmaxZone2;
a second sub-area ranging from a value of state of charge MinSOCZone3 to a value of state of charge MaxSOCZone3; said value of state of charge MinSOCZone3 corresponding to a predetermined voltage value VminZone3.

14. The assembly of claim 13, wherein the cell comprises a positive electrode containing:

either a compound a) of formula $Li_xM_yP_zO_{4-t}$ wherein M is selected from the group consisting of Fe, Co, Ni, Mn, Al and mixtures thereof, x ranges from 0.9 to 1.1 and y 0.9 to 1.1, z from 0.9 to 1.1 and t ranging from 0 to 0.4, where M is preferably Fe or a mixture of Fe and Mn;

or a mixture b) of compound a) with a lithium-containing oxide of formula $LiM^1O_2$ wherein $M^1$ denotes at least one element selected from Co, Ni, Mn, Al and Fe, or a mixture thereof.

15. The assembly of claim 14, wherein the electrochemically active material is selected from a composition comprising:

at least 50% by weight of compound a);

less than 50% by weight of a lithium-containing oxide of formula $LiM^1O_2$ wherein $M^1$ denotes at least one element selected from Co, Ni, Mn, Al and Fe, or a mixture thereof.

16. The assembly of claim 15, wherein the composition comprises:

at least 90% by weight of compound a), a surface of which is preferably at least partially covered by a layer of carbon;

10% or less by weight of the lithium-containing oxide of the formula $LiM^1O_2$.

17. An apparatus configured to estimate state of charge of an electrochemical cell having a charge profile, comprising:

a memory configured to store at least one sequence of stored instructions; and a processor configured to execute the at least one sequence of stored instructions, which when executed by the processor implement the method of claim 1.

18. A tangible non-transitory computer-readable storage device having instructions stored therein that when executed, allow a computer processor to perform the method of claim 1.

* * * * *